US010908658B2

(12) United States Patent
Papen et al.

(10) Patent No.: US 10,908,658 B2
(45) Date of Patent: Feb. 2, 2021

(54) SYSTEM AND METHOD FOR COOLING COMPUTING DEVICES WITHIN A FACILITY

(71) Applicant: CORE SCIENTIFIC, INC., Bellevue, WA (US)

(72) Inventors: Jeffrey Papen, Wilsonville, OR (US); Matthew Renner, San Francisco, CA (US); Montgomery Sykora, Wilmington, DE (US); Weston Adams, Logandale, NV (US)

(73) Assignee: Core Scientific, Inc., Bellevue, WA (US)

(*) Notice: Subject to any disclaimer, the term of this patent is extended or adjusted under 35 U.S.C. 154(b) by 0 days.

(21) Appl. No.: 16/529,384

(22) Filed: Aug. 1, 2019

(65) Prior Publication Data

US 2020/0042054 A1     Feb. 6, 2020

Related U.S. Application Data

(63) Continuation-in-part of application No. 16/268,428, filed on Feb. 5, 2019, now Pat. No. 10,701,837, and
(Continued)

(51) Int. Cl.
*G06F 1/20* (2006.01)
*H05K 7/20* (2006.01)

(52) U.S. Cl.
CPC ........... *G06F 1/20* (2013.01); *H05K 7/20736* (2013.01); *H05K 7/20745* (2013.01); *H05K 7/20836* (2013.01)

(58) Field of Classification Search
CPC ... H05K 7/20745; H05K 7/1497; F24F 13/04; F24F 13/06
(Continued)

(56) References Cited

U.S. PATENT DOCUMENTS

| 3,363,534 A | 1/1968 | Spradling |
| 3,614,922 A | 10/1971 | Sobin |

(Continued)

FOREIGN PATENT DOCUMENTS

| WO | 02104090 A1 | 12/2002 |
| WO | 2013039645 | 3/2013 |

OTHER PUBLICATIONS

PCT Partial International Search Report dated Nov. 11, 2019 for copending International Application No. PCT/US2019/044673.
(Continued)

*Primary Examiner* — Mukundbhai G Patel
(74) *Attorney, Agent, or Firm* — Fishman Stewart PLLC

(57) ABSTRACT

A system for cooling computing devices may include at least one facility, at least one cool air aisle disposed within the at least one facility, at least one hot air aisle, at least one air inlet, and at least one exhaust outlet. The system may also include a plurality of computing devices including a plurality of computing device fans arranged within the at least one cool air aisle. An internal air pressure within the at least one cool air aisle provided via the plurality of computing device fans may be lower than an external air pressure of the external environment. The plurality of computing device fans may be configured to provide sufficient airflow of outside air through the at least one facility to cool the plurality of computing devices.

20 Claims, 14 Drawing Sheets

Related U.S. Application Data a continuation-in-part of application No. 16/268,392, filed on Feb. 5, 2019, and a continuation-in-part of application No. 16/268,433, filed on Feb. 5, 2019, now Pat. No. 10,694,642, and a continuation-in-part of application No. 16/268,410, filed on Feb. 5, 2019, now Pat. No. 10,701,835, and a continuation-in-part of application No. 16/268,424, filed on Feb. 5, 2019, now Pat. No. 10,701,836, and a continuation-in-part of application No. 16/053,648, filed on Aug. 2, 2018, now Pat. No. 10,299,412.

(58) Field of Classification Search
USPC .................................................... 361/679.46
See application file for complete search history.

(56) References Cited

U.S. PATENT DOCUMENTS

| | | | |
|---|---|---|---|
| 4,872,504 A | | 10/1989 | Huebner |
| 6,135,875 A | * | 10/2000 | French ................. H02B 1/565 |
| | | | 361/695 |
| 6,483,699 B1 | * | 11/2002 | Salmonson ............. G06F 1/20 |
| | | | 165/80.3 |
| 8,223,495 B1 | | 7/2012 | Carlson et al. |
| 8,659,895 B1 | | 2/2014 | Carlson et al. |
| 8,857,204 B2 | | 10/2014 | Reytblat |
| 8,943,757 B2 | | 2/2015 | Parizeau et al. |
| 9,313,929 B1 | | 4/2016 | Malone et al. |
| 9,476,657 B1 | | 10/2016 | Pettis et al. |
| 9,554,491 B1 | | 1/2017 | Wong et al. |
| 9,629,285 B1 | | 4/2017 | Lachapelle et al. |
| 9,674,988 B2 | | 6/2017 | Dernis et al. |
| 9,677,777 B2 | | 6/2017 | Karamanos et al. |
| 2008/0055848 A1 | | 3/2008 | Hamburgen et al. |
| 2009/0310300 A1 | | 12/2009 | Chrysler |
| 2010/0188810 A1 | | 7/2010 | Andersen et al. |
| 2011/0138708 A1 | | 6/2011 | Chazelle et al. |
| 2012/0024502 A1 | | 2/2012 | Khalifa et al. |
| 2012/0142265 A1 | | 6/2012 | Wei |
| 2012/0197828 A1 | | 8/2012 | Yi |
| 2012/0258654 A1 | | 10/2012 | Peng et al. |
| 2013/0062047 A1 | | 3/2013 | Vaney et al. |
| 2013/0244563 A1 | * | 9/2013 | Noteboom ......... H05K 7/20309 |
| | | | 454/250 |
| 2014/0069127 A1 | | 3/2014 | Bailey et al. |
| 2014/0133092 A1 | | 5/2014 | Leckelt et al. |
| 2015/0241888 A1 | | 8/2015 | Kodama |
| 2015/0327408 A1 | | 11/2015 | Ruiz et al. |
| 2016/0021782 A1 | * | 1/2016 | Kurosaki .......... H01M 10/6563 |
| | | | 429/71 |
| 2016/0192542 A1 | * | 6/2016 | LeFebvre ........... H05K 7/20836 |
| | | | 361/679.47 |
| 2016/0249484 A1 | | 8/2016 | Parizeau et al. |
| 2017/0042067 A1 | * | 2/2017 | Parizeau ........... H05K 7/20745 |
| 2017/0176029 A1 | | 6/2017 | Wilding et al. |
| 2017/0196125 A1 | | 7/2017 | Crosby, Jr. et al. |
| 2017/0269648 A1 | | 9/2017 | Ruiz et al. |
| 2018/0077822 A1 | * | 3/2018 | Sloan ................. H05K 7/20136 |

OTHER PUBLICATIONS

International Search Report dated Jan. 23, 2020 for copending International Application No. PCT/US2019/044673.

Cindy Kiddy: "psd1212ptb1 SUNON", Taiwan (R.O.C), Dec. 31, 2010 (Dec. 31, 2010), pp. 1-14, XP055657800, Retrieved from the Internet: URL:https://nl.mouser.com/datasheet/2/659/ Sunon-08142017-PSD1212PTB1-A.(2).Z.GN%20(D12018800G-1216991.pdf [retrieved on Jan. 14, 2020].

* cited by examiner

SYSTEM AND METHOD FOR COOLING COMPUTING DEVICES WITHIN A FACILITY

CROSS-REFERENCE TO RELATED APPLICATIONS

This application claims priority to U.S. patent application Ser. No. 16/053,648, filed on Aug. 2, 2018, now granted as U.S. Pat. No. 10,299,412, U.S. patent application Ser. No. 16/268,410, filed on Feb. 5, 2019, U.S. patent application Ser. No. 16/268,392, filed on Feb. 5, 2019, U.S. patent application Ser. No. 16/268,433, filed on Feb. 5, 2019, U.S. patent application Ser. No. 16/268,428, filed on Feb. 5, 2019, and U.S. patent application Ser. No. 16/268,424, filed on Feb. 5, 2019, the contents of each of which are hereby incorporated by reference in their entirety.

TECHNICAL FIELD

The present disclosure generally relates to a system for cooling computing devices within a facility or containment unit. The disclosure also generally relates to a method of cooling the computing devices with the system.

BACKGROUND

Relatively large facilities are commonly used to house computing devices, which may function as data or processing centers. The increasing use of online computing and cloud computing services has greatly increased the demand for such facilities. The use of computing devices in the blockchain art has likewise increased the demand for computing device facilities. The substantial amount of computing devices within a facility often results in substantial heat generation within the facility due to the appreciable power requirements of the computing devices, which can be in excess of 30 kilowatts per linear foot of computing space. Various means have been used to cool such facilities including the use of conventional HVAC systems, liquid cooled systems and the like.

SUMMARY

The examples described herein relate to a system and method for cooling computing devices within a facility. According to one aspect, a system for cooling computing devices within a facility is described. The facility has an interior space that includes a supply air space and an exhaust air space. The supply air space is configured to supply cool air to the computing devices to cool the computing devices during operation of the computing devices. The exhaust air space is configured to exhaust or vent heated air generated from the computing devices inside the facility to the external environment. The system includes an air inlet that is coupled with an exterior wall of the facility and that is configured to deliver cool air to the supply air space from the external environment. The system also includes an exhaust air damper that is configured to exhaust the heated air from the exhaust air space to the external environment. The system further includes a plurality of computing devices that are arranged within the interior space to partition at least a portion of the supply air space from the exhaust air space. Some, most, or substantially each of the computing devices include a fan that is capable of moving the cool air across one or more heat generating components of the computing device to cool the heat generating components.

The system additionally includes an air filter assembly that is positioned between the supply air space and the computing devices. The air filter assembly is configured to filter the cool air that is supplied to the computing devices from the air supply space. The system also includes a mixing damper that is positioned within the interior space of the facility between the supply air space and the exhaust air space. The mixing damper is operable to control an amount of exhaust air that is supplied from the exhaust air space to the supply air space for mixing with the cool air supplied through the air inlet. Airflow through the system is substantially or entirely driven by the combined airflow of at least a plurality of the fans of the computing devices.

According to another aspect, a method of cooling computing devices within a facility is provided. The facility has an interior space that includes a supply air space and an exhaust air space. The method includes flowing cool air from an external environment through an air inlet of an exterior wall of the facility to supply the cool air to the supply air space. The method also includes flowing the cool air through an air filter assembly to filter the cool air and thereby remove unwanted particles and debris from the cool air. The method further includes flowing the filtered cool air through a plurality of computing devices that are arranged within an interior space of the facility so that the computing devices partition at least a portion of the supply air space from the exhaust air space. Some, most, or substantially each of the computing devices include a fan that is capable of moving the filtered cool air across one or more heat generating components of the computing device to cool the heat generating components and heat the filtered cool air. The heated air flows into the exhaust air space from the computing devices subsequent to cooling the heat generating components. The method additionally includes flowing the heated air through an exhaust air damper to exhaust the heated air from the exhaust air space to the external environment. Airflow of the cool air and the heated air is substantially or entirely driven by the combined airflow of at least a plurality of the fans of the computing devices.

According to one aspect, a system for cooling computing devices includes at least one facility, at least one cool air aisle disposed within the at least one facility, and at least one hot air aisle. The system also includes at least one air inlet connected to the at least one facility through which air is flowable. The at least one air inlet fluidically connects the at least one cool air aisle to an external environment surrounding the at least one facility. The system further includes at least one exhaust outlet connected to the at least one facility through which air is flowable out of the at least one facility, and a plurality of computing devices arranged within the at least one cool air aisle. The plurality of computing devices include a plurality of heat generating components and a plurality of computing device fans configured to move air across the plurality of heat generating components. The at least one cool air aisle and the at least one hot air aisle are fluidically connected via the plurality of computing devices. An internal air pressure within the at least one cool air aisle is lower than an external air pressure of the external environment. The internal air pressure within the at least one cool air aisle is provided via the plurality of computing device fans. The plurality of computing device fans are configured to provide sufficient airflow of outside air through the at least one facility to cool the plurality of computing devices.

According to another aspect, a method of cooling computing devices of a system including at least one facility, at least one cool air aisle disposed within the at least one facility, and a plurality of computing devices disposed within the at least one cool air aisle, includes generating an internal air pressure within the at least one cool air aisle via a plurality of computing device fans of the plurality of computing devices. The internal air pressure being lower than an external air pressure of an external environment surrounding the at least one facility. The method also includes drawing unconditioned outside air from the external environment into the at least one cool air aisle through at least one air inlet via the plurality of computing device fans generating the internal air pressure. Cooling a plurality of heat generating components of the plurality of computing devices and heating the outside air via flowing the outside air across the plurality of heat generating components. Expelling the heated outside air into a hot air aisle via the plurality of computing device fans. The plurality of computing device fans are configured to provide sufficient airflow of outside air through the at least one facility to cool the plurality of computing devices.

According to another aspect, a system for cooling computing devices includes a facility including a plurality of exterior walls defining a cool air aisle within the facility, at least one air inlet fluidically connecting the cool air aisle to an external environment surrounding the facility, and at least one exhaust outlet through which is flowable out of the facility. The system further includes a hot air aisle disposed directly adjacent to the at least one exhaust outlet. The system also includes a plurality of computing devices arranged within the cool air aisle along and directly adjacent to an exterior wall of the plurality of exterior walls in which the at least one exhaust outlet is disposed. The plurality of computing devices include a plurality of heat generating components and a plurality of computing device fans configured to move air across the plurality of heat generating components. The cool air aisle and the hot air aisle are fluidically connected via the plurality of computing devices. A static pressure of approximately 0.6 inAq (inches of water) across the plurality of computing device fans is provided between the cool air aisle and the hot air aisle such that outside air within the external environment is drawn into the cool air aisle. The static pressure is provided via the plurality of computing device fans. The plurality of computing device fans are configured to provide sufficient airflow of outside air through the at least one facility to cool the plurality of computing devices.

BRIEF DESCRIPTION OF THE DRAWINGS

The present technology is described in conjunction with the appended figures.

Figure 1:
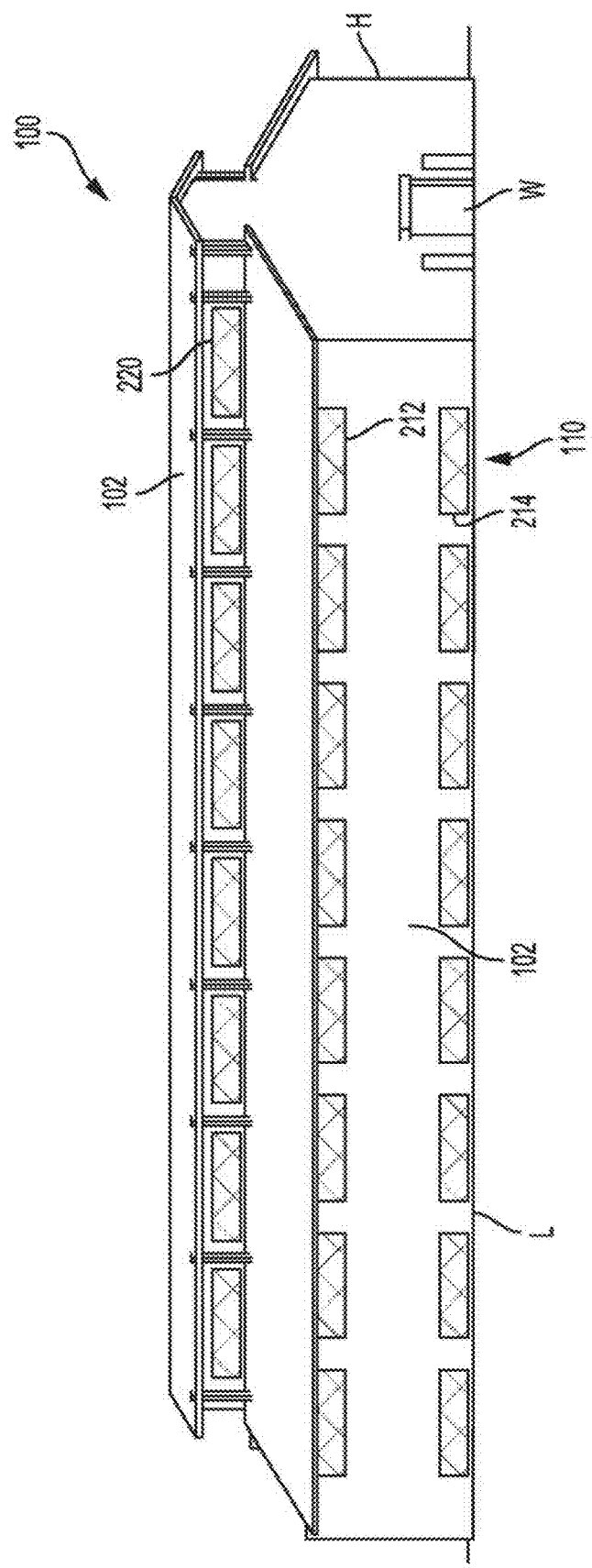
FIG. 1 illustrates an example of a system that is designed to cool computing devices within a facility.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The ensuing description provides exemplary illustrations only, and is not intended to limit the scope, applicability or configuration of the disclosure. Rather, the ensuing description of the exemplary illustrations will provide those skilled in the art with an enabling description for implementing one or more exemplary illustrations. It being understood that various changes may be made in the function and arrangement of elements without departing from the spirit and scope of the invention as set forth in the appended claims.

The exemplary illustrations described herein relate to a system and method for cooling computing devices within a facility. In particular, the system is designed to cool computing devices that are involved in processes related to blockchain technology, such as "mining" or participating in proof-of-work processes that are known in the blockchain art. The system and method may be particularly useful in cooling computing systems that are participating in cryptocurrency mining.

The term computing device as used herein is meant to cover any device that performs computing operations and may include personal computers, servers, host devices, central processing unit (CPU) devices, graphics processing unit (GPU) devices, field programmable gate array (FPGA) devices, application-specific integrated circuit (ASIC) devices, a dedicated mining device, any combination of said devices, and the like.

The systems and method described herein use outside ambient air to cool the computing systems. Unlike traditional systems, the cooling system is not designed to cool the outside air with conventional heating, ventilation, and air conditioning (HVAC) components, such as a compressor, an evaporator coil, a condensing coil, an expansion valve, a cooling room air conditioner (CRAC), a chiller, a cooling tower, direct expansion refrigeration, etc. Rather, 100% of the air that is used in the system is provided from the external environment. The air that is heated by the computing devices may be recirculated and combined with the cool air when the cool air is too cold or when the humidity in the cool air is too high. But the air that is used in the system is not cooled by conventional HVAC systems. As used herein, the term "cool air" refers to air that is supplied from the environment surrounding the facility. The outside air that flows into the facility may be termed "cool air" to differentiate the outside air that enters the facility from the air that remains outside the facility. The cool air is ambient air in the environment and thus, the cool air is the same temperature as the air surrounding the cooling system facility. The temperature of the cool air is lower than the temperature of the computing systems, but may vary drastically depending on the season, weather conditions, and/or other environmental conditions. For example, the temperature of the cool air may vary between 0 and 95 degrees Fahrenheit or more.

In addition, the system typically does not include a dedicated fan, dedicated fans, or a dedicated blowing mechanism that is designed to push air through the system. Rather, the airflow through the system is generated by one or more fans of the computing devices, and typically some combination of computing device fans. The cooling effect of the system is achieved through a combination of the facility design and the combined effect of the computing device fans. Stated differently, the fans of the computing devices (e.g., servers, CPUs, GPUs, etc.) push the air through the system. In such instances, the system does not include any other fans or air moving devices other than the fans of the computing devices. As such, the system is a completely passive system in that the fans of the computing device drive airflow through the system and in that the cooling is achieved via convective cooling from the cool air, which in some instances is recirculated in the system after cooling the computing devices. In other illustrative examples, the system may include one or more dedicated fans that aid the computing device fans in pushing the air through the system.

Since the airflow through the system is dependent entirely, or essentially entirely, on the computing device fans, the system is designed to minimize pressure losses or pressure drops as the air flows through the system. This is achieved, in part, by maximizing the inflow of air from the environment, and/or the air that is recirculated in the system, and by employing low pressure drop filters, large cross-sectional areas within the facility, and other components. In this manner, the computing device fans do not experience undue stress in pushing the air through the system. The system is also designed to minimize or prevent the formation of vortices, unless explicitly required to counteract airflow stratification, in order to increase and maintain the flow of air through the system.

As briefly mentioned above, the system is further designed so that the heated air may be recirculated within the system and combined with fresh outside air from the external environment. The heated air may be combined with the fresh outside air to treat the fresh outside air to a specific target temperature and/or environmental humidity condition by raising the temperature of the fresh outside air. The system is automated to open one or more dampers, or airflow valves, when the system determines that the temperature of the outside air is too low or that the relative humidity of the outside air is too high. The recirculated air is mixed with the outside air in a mixing chamber. Mixing of the heated air and outside cool air is maximized in a passive manner via the use of one or more turbulators or elongate members, which is a component that is designed to increase turbulent flow of air within the mixing chamber and prevent temperature based airflow stratification. The turbulators may be projections, arms, or other members, that project or extended into the mixing chamber. The surface of the turbulators may be designed to induce turbulent airflow.

Having described several features of the system and method generally, additional aspects and features will be readily apparent in view of the description of the various drawings provided herein below.

Referring now to FIG. 1, illustrated is an example of a system that is designed to cool computing devices within a facility 100. The facility 100 includes a plurality of exterior walls 102 that define the exterior surface of the structure. The facility 100 includes one or more sections 110, and commonly a plurality of sections 110, in which each section 110 is partitioned or divided from an adjacent section 110 and in which each section 110 is designed to cool computing devices within the respective section. FIGS. 2-6 illustrate the sections in greater detail, but as illustrated in FIG. 1, each section 110 typically includes a first air inlet 212, a second air inlet 214, and an air outlet or exhaust 220. The system is essentially modular and the facility 100 may have a length L that is as short as a single section (e.g., 10-12 feet or approximately 3-3.5 meters) or that is as long as desired, such as 300 feet or more (approximately 91 meters or more). The sections 110 in the facility 100 commonly have identical configurations, however, one or more sections 110 within the facility 100 may differ from another section as desired. For example, a facility 100 may include one or more sections having the configuration illustrated in FIG. 2 and may also include one or more sections having the configuration illustrated in FIG. 6.

Figure 2:
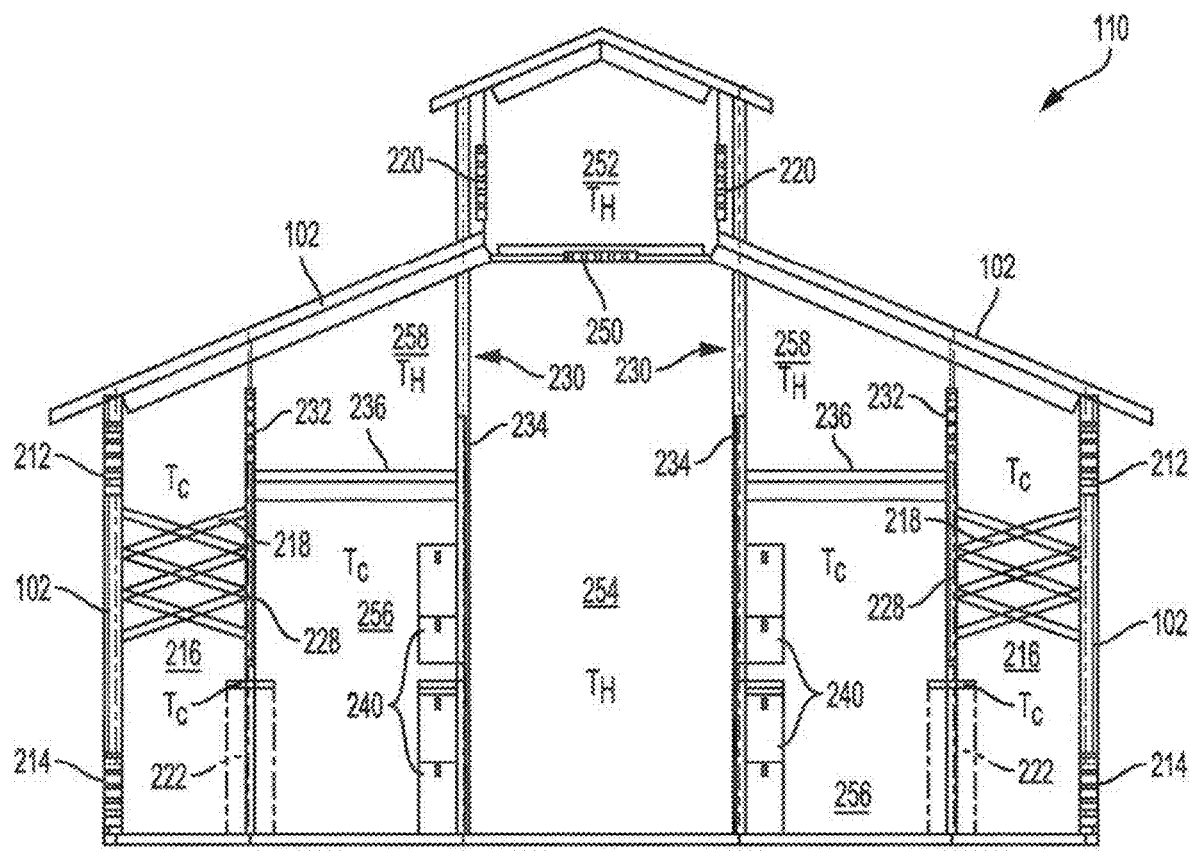
FIGS. 2-3 illustrate an example of a section of the facility of FIG. 1.

As illustrated in FIG. 2, each section 110 has a symmetric design so that the first air inlet 212, second air inlet 214, exhaust 220, computing devices 240, etc. are essentially mirrored about a midpoint of the facility 100. The facility 100 has a width W that may be selected as desired or needed, and which is commonly between 30 and 60 feet (approximately 9 and 18 meters), and more commonly between 40 and 50 feet (approximately 12 and 15 meters). The facility 100 likewise has a height H that may be selected as desired or needed, and that is commonly between 40 and 50 feet (approximately 12 and 15 meters) so that the facility 100 is essentially a four story building. In such instances, two of the stories may include the computing devices, a third story may be a space for recirculated exhaust air, and a fourth story may be, or include, the exhaust air outlet 220. It should be realized that the configuration of the facility 100 may be varied depending on need or other conditions.

The facility 100 is oriented in relation to the environment so that the exhaust air is blown away from the facility 100. Specifically, the facility 100 is oriented so that the common prevailing winds are directed to flow along a longitudinal side, or along both longitudinal sides, of the facility 100. This orientation ensures that most or all of the exhaust air does not mix with the ambient or fresh outside air in the environment. Since the exhaust air does not mix with the ambient fresh outside air, the exhaust air is not unintentionally recirculated into the facility 100 via the air inlet 212, which unintentional mixing may raise the temperature of the fresh outside air to an undesirable level, such as above 90 to 100 degrees or more. Positioning of the exhaust outlet 220 at or near the top of the facility 100 aids in ensuring that the exhausted air does not unintentionally mix with the fresh outside air.

The facility 100 is similarly oriented so that the exhaust is blown away from other adjacent facilities (not shown) so as to avoid unintentional mixing of the exhaust air with the fresh outside air that is adjacent to a neighboring facility. In some instances, it may be desirable to ensure that the facility 100 is located in an area that commonly experiences a modest wind, such as between 2-10 miles per hour (mph) or between 4-6 mph. The modest wind may ensure that the exhaust air is blown away from the facility 100 without being overly disruptive to the circulation of air within the facility 100. In selecting a location for the facility 100, and/or an orientation of the facility 100 within a given location, historical weather data may be analyzed to determine common weather conditions (e.g., wind direction, wind speed, high and low temperatures, humidity levels, etc.) within the location to ensure that the location is proper for the passive cooling that the system employs. If the common temperature is too hot, too humid, too windy, and the like, the location may not be suitable for the passive cooling system described herein.

The system may be designed to accommodate local isolated changes in weather. For example, if the local wind is flowing in a more perpendicular direction relative to the longitudinal sides of the facility 100, one or more vents or louvers on the first air inlet 212 and/or second air inlet 214 on the upwind side of the facility 100 may be closed to reduce air pressure on the upwind side of the facility and/or to reduce air swirling or air vortices within the facility 100. The closing of the vents or louvers may also be used to prevent a vacuum from being created on an opposite side of the facility 100. In some instances, baffling may be used with the vents or louvers, or in place of the vents or louvers, to counteract prevailing winds.

Figure 3:
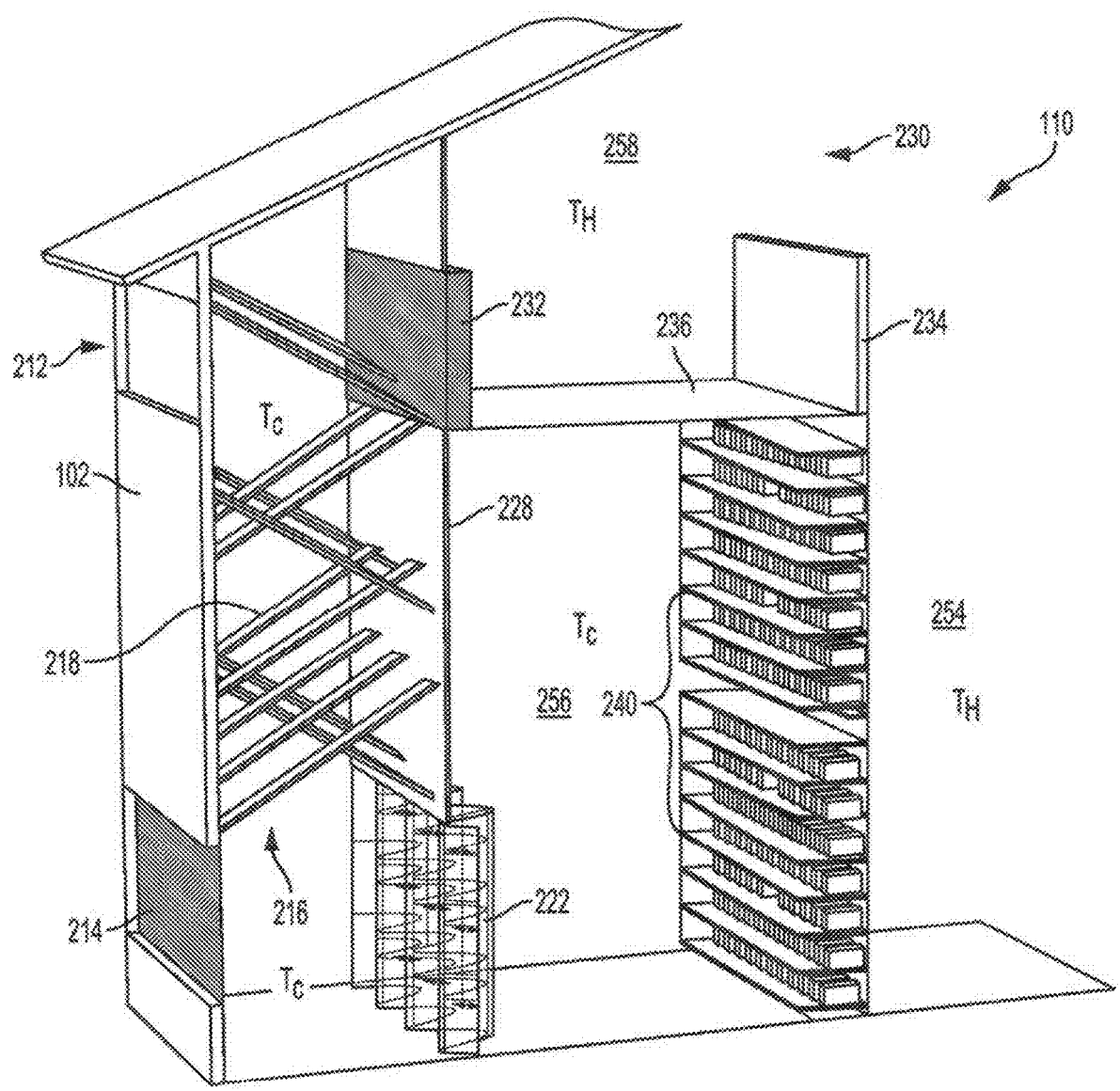

Referring now to FIGS. 2 and 3, illustrated is an example of a section 110 of the facility 100. The section 110 may be any width, but is more commonly between 10-12 feet (approximately 3-3.5 meters) wide. As briefly described, the facility 100 may include one or more of the sections 110, of which the section 110 of FIGS. 2 and 3 is a representative example. FIG. 2 is a cross sectional view of the facility 100 and illustrates an entire section 110 while FIG. 3 is perspective view of half of the section 110. FIGS. 2 and 3 also illustrate the interior space of the facility 100 and the various components that are positioned within the interior space. In particular, the section 110 includes a supply air space, or cool air aisle, that is defined as the space between the first air inlet 212, the second air inlet 214, and the computing devices 240. The supply air space, or cool air aisle, includes a mixing chamber 216 and a computing space 256. The computing space 256 is partitioned or divided from the mixing chamber 216 by an interior wall 228 and filter structure 222. The supply air space, or cool air aisle, includes cool air Tc that is supplied to the computing devices 240 to cool the computing devices 240 during operation of the devices. The cool air Tc is typically outside air that is supplied through the first or second air inlets, 212 and 214, which may or may not be mixed with exhaust air as described herein.

The section 110 also includes an exhaust air space, or hot air aisle, that is defined as the space between the computing devices 240, a mixing damper 232, and the exhaust air outlet 220. The exhaust air space, or hot air aisle, includes a main exhaust air space 254, a recirculated hot air space 258 (hereinafter recirculated air space 258), and a vent air space 252. The exhaust air space, and in particular the main exhaust air space 254 and the vent air space 252, are configured to exhaust heated air Tx from the computing devices 240 to the external environment via exhaust outlet 220. The recirculated air space 258 is typically positioned above the computing space 256 and is partitioned or divided from the computing space 256 via a floor 236. The floor 236 is a solid floor material that is impermeable to air in order to ensure that the cool air Tc does not flow into the recirculated air space 258.

The recirculated air space 258 is also divided from the mixing chamber 216 via a mixing damper 232 that is positioned on an exterior end of the recirculated air space 258. In some exemplary approaches, a wall or other partition may extend vertically upward from the mixing damper 232 to divide the recirculated air space 258 from the mixing chamber 216. As described in greater detail herein, the mixing damper 232 may be opened to allow exhaust air TH to flow into the mixing chamber 216 for mixing with the cool air Tc, or the mixing damper 232 may be closed to prevent the heated air TH from flowing into the mixing chamber 216. In this manner, the mixing damper 232 is operable to control an amount of exhaust air TH that is supplied from the main exhaust air space 254 to the supply air space for mixing with the cool air Tc supplied through the first air inlet 212. The mixing damper 232 may have various dimensions, but is commonly between 3 and 8 feet (approximately 1 and 2.5 meters) high and 4-12 (approximately 1-3.5 meters) feet wide. In a specific example, the mixing damper 232 is approximately 4 feet (approximately 1 meter) high and 8 feet (approximately 2.5 meters) wide.

The vent air space 252 may be divided from the main exhaust air space 254 via a damper or vent 250, which may be opened to allow the heated air TH to vent to the external environment or that may be partially or fully closed to force heated air TH into the recirculated air space 258 for mixing with the cool air Tc. The damper 250 and/or exhaust outlet 220 may be similarly sized to the mixing damper 232, although the damper 250 is typically larger than the exhaust outlets 220 due to the damper 250 typically venting considerably more air than either exhaust outlet 220. In some illustrative examples, the damper 250 may not be included in the section 110. Rather, the section 110 may only include the exhaust outlet 220. In other examples, the section 110 may not include the exhaust outlet 220 and instead may only include the damper 250, which may be used to control and regulate exhausting of the heated air TH and/or recirculation of the heated air TH within the section 110. When the section 110 includes both the damper 250 and the exhaust outlet 220, louvers or other airflow control are typically only included in the damper 250 and the exhaust outlet 220 is open. The vent air space 252 typically has a width that corresponds to the width of the main exhaust air space 254 or is slightly larger than the main exhaust air space 254. In a specific example, the vent air space 252 has a width of approximately 13 feet (approximately 4 meters). The vent air space 252 may be designed to vent a considerable amount of air, such as between 40,000 and 60,000 cubic feet per minute (CFM) of exhaust air TH. Accordingly, the height and width of the vent air space 252 and the size of the damper 250 and/or exhaust outlets 220 are typically selected to vent this volume of air, although the exact dimensions may be selected to vent less air as required by the design and intended use of the section 110. The pitch of the roof above the vent air space 252, and/or in other portions of the section 110, may be 5/12 pitch.

A space 230 between the recirculated air space 258 and the main exhaust air space 254 is open so that the recirculated air space 258 is in fluid communication with the main exhaust air space 254. The open space 230 ensures that the heated air TH is able to flow from the main exhaust air space 254 to the recirculated air space 258 and to the mixing damper 232. A vertically oriented parapet or partition 234 extends upward from the floor 236 of the recirculated air space 258 to partially divide or partition the recirculated air space 258 from the main exhaust air space 254. The partition 234 aids in guiding the heated air TH in a vertical direction and minimizes the formation or vortices that may otherwise occur in the recirculated air space 258 and in which the heated air TH may continuously circulate. The partition 234 may extend upward from the floor 236 between 1 and 6 feet (approximately 0.3 and 2 meters), and more commonly between 2 and 4 feet (approximately 0.5 and 1 meters).

The computing devices 240 partition the computing space 256 from the main exhaust air space 254. The computing devices 240 form a wall between the computing space 256 and the main exhaust air space 254, or are positioned or housed on a wall between the computing space 256 and the main exhaust air space 254. A distance between opposing walls of the computing devices 240 may be between 5 and 20 feet (approximately 1.5 and 6 meters), but is more commonly between 10 and 14 feet (approximately 3 and 4 meters). In a specific example, the distance between opposing walls of the computing devices 240 is approximately 12 feet (approximately 3.5 meters). The main exhaust air space 254 may similarly be between 5 and 20 feet (approximately 1.5 and 6 meters), and more commonly between 10 and 14 feet (approximately 3 and 4.5 meters). In a specific example, the main exhaust air space may be approximately 12 feet (approximately 3.5 meters). The main exhaust air space 254 is also typically between 15 and 50 feet (approximately 4 and 15 meters) tall, and more commonly between 20 and 40 feet (approximately 6 and 12 meters) tall.

At least some of the computing devices 240 include a fan that is capable of moving the cool air Tc across one or more heat generating components of the computing devices 240 to cool the heat generating components. In some exemplary illustrations, most of the computing devices 240, or all of the computing devices 240, include a fan that moves the cool air Tc across the heat generating component(s). Each of the fans is oriented so that the air flows from the computing space 256 to the main exhaust air space 254. The computing devices 240 are oriented or arranged relative to one another, and/or in relation to the wall that partitions the computing space 256 from the main exhaust air space 254, so that the air is able to flow from the computing space 256 into the main exhaust air space 254, but is prevented from flowing from the main exhaust air space 254 into the computing space 256. Stated differently, the computing devices 240, and/or wall, partition the computing space 256 from the main exhaust air space in a relatively air tight manner so that a flow of air from the main exhaust air space 256 to the computing space 254 is negligible. In this manner, the cool air Tc is forced across the heat generating component(s) of the computing devices 240 and is heated by the heat generating component(s). The heated air Tx flows into the main exhaust air space 254 and is exhausted from the section 110 or is recirculated within the section 110 as described herein.

The dimensions of the computing space 256 may be varied as desired. For example, in some illustrations, the computing space 256 may be a single floor or story of the section 110, while in other illustrations, the computing space 256 may be multiple floors or stories of the section 110. In FIGS. 2 and 3 the computing space 256 is two floors or stories of the facility 100 and is roughly 10-12 feet (approximately 3-3.5 meters) wide and 15-22 feet (approximately 4.5-7 meters) high. The computing devices 240 may be arranged in any manner within the computing space 256, but are more commonly arranged in rows and columns. The computing space 256 may include essentially any number of computing devices, such as between 50 and 200 devices, although between 120 and 180 computing devices is more common. In the illustrated example, each row includes roughly 12 computing devices and the computing space 256 includes approximately roughly 14 rows. This arrangement results in roughly between 150 and 170 computing devices, although this arrangement is for illustrative purposes only and is not meant to be limiting in any manner. As a person of skill will readily recognize, more or fewer computing devices may be employed as desired and the arrangement and number is dependent in part on the size of the computing devices.

As briefly mentioned above, airflow through the section 110 is substantially driven by the combined airflow of a plurality of the computing device fans. More commonly, the airflow is driven entirely by the fans of the computing device so that the section 110 is free of any other air moving device, such as a dedicated fan or blowing mechanism. Stated differently, the computing device fans may be the only devices or mechanisms within the section 110 that move or blow the air through the section 110. While the fans of each computing device 240 are typically utilized to drive airflow through the section 110, the system does not require that the fan of each computing device 240 be operated to drive a sufficient airflow through the section 110. Rather, it should be appreciated that some of the fans may not be operated and/or that some of the computing devices 240 may not include fans or other air moving devices or components at all. All of the computing device fans, or substantially all of the computing device fans, are typically operated to move air through the section 110 since the operation of less than 100% of the fans may create areas where backflow occurs, such as the exhaust air flowing backward into the computing device space. The computing devices 240 may be robust machines that are tolerant to variations in the temperature and thus, changes in airflow due to the amount of fans being used or the individual flow characteristics of a specific fan to drive the airflow may not substantially negatively impact the operation of the computing devices 240.

The combined effect of the computing device's fans may result in a considerable volume of air being moved through the section 110. For example, the combined computing device fans may move more than 10,000 CFM of air through the section 110. The section 110 design that is illustrated in FIGS. 2 and 3 may move between 40,000 and 60,000 CFM of air through the section. In a specific example, the section 110 of FIGS. 2 and 3 may move approximately 54,000 CFM of air with each half of the section 110 moving approximately 27,000 CFM of air. The exhaust outlet 220, damper 250, mixing damper 232, and/or first and second air inlets, 212 and 214, are sized to accommodate this large volume of air movement. Each of these components may be configured to allow airflow through the respective component at an airspeed of between 300 and 600 feet per minute, and more commonly between 400 and 500 feet per minute.

As briefly mentioned above, cool air Tc is able to flow into the section 110 via the first air inlet 212 and the second air inlet 214. The first and second air inlets, 212 and 214, may have various dimensions, but are commonly between 3-5 feet (approximately 1-1.5 meters) high and 8-12 feet (approximately 2.5-4 meters) wide. In a specific example, the first and second air inlets, 212 and 214, are approximately 4 feet (approximately 1 meter) high and 8 feet (approximately 2.5 meters) wide. The second air inlet 214 is positioned vertically below the first air inlet 212.

The first air inlet 212 typically does not include a damper or other closable vent and as such, outside air is essentially always able to flow through the first air inlet 212 into the interior of the section 110. However, the first air inlet 212 typically does include a static louver, mesh screen, or other component that prevent animals or debris from accessing the interior of the section 110. Unlike the first air inlet 212, the second air inlet 214 includes a damper or closable vent. The damper is used to open the second air inlet 214 when airflow through the second air inlet 214 is desired and is also used to close the second air inlet 214 when airflow through the intake is not desired. The damper may be partially or fully closed to control the flow of air through the second air inlet 214. The damper is commonly closed when the mixing damper 232 is opened to combine the heated air TH with the cool air Tc. The degree of closure of the second air inlet's damper may be correlated with the degree of openness of the mixing damper 232 to achieve a desired mixing ratio of heated air TH and cool air Tc. In this manner, a finite and constant amount of air may flow into and through the mixing chamber 216. The opening and closing of the second air inlet's damper is further described in relation to FIGS. 4-5.

An air filter 222 is positioned between the mixing chamber 216 and the computing space 256. The air filter 222 is configured to filter the cool air Tc that is supplied through the first and/or second air inlets, 212 and 214. The air filter 222 is illustrated as being a vertical wall that is coupled with a bottom end of the interior wall 228 and a floor of the facility 100, but the air filter 222 may be placed essentially anywhere between the mixing chamber 216 and the computing space 256 and/or have any orientation desired. The air filter 222 is commonly 8-12 feet (approximately 2.5-3.5 meters) wide and approximately 6-12 feet (approximately 2-3.5 meters) tall. The width and height of the air filter 222 may be varied depending on a required or desired pressure drop with larger cross-sectional areas of the filter 222 resulting in a lower pressure drop. The air filter 222 may be aligned with the second air inlet 214 so that when opened, air is able to flow directly from the second air inlet 214 and through the air filter 222. Alignment of the air filter 222 and the second air inlet 214 is not required in the section 110.

The air filter 222 is commonly an accordion or pleated filter, which maximizes the available surface area for filtering the cool air Tc and minimizes the pressure drop or loss across the air filter 222. Since the airflow through the systems is dependent mostly or entirely on the combined airflow of the computing device's fans, minimizing the pressure drop across the air filter 222 is more important than in conventional systems that have dedicated high output fans or blower mechanisms. An air filter 222 that is designed to remove debris or particles too small may overly burden the computing device's fans, which may cause the computing devices 240 to prematurely fail. An air filter with a minimum efficiency reporting value (MERV) rating of between 7-8 has been found to provide a sufficient degree of air filtering and an acceptable pressure drop. Accordingly, the air filter 222 commonly has a MERV rating of between 7 and 8. As illustrated in FIGS. 2 and 3, in some examples, only a single air filter 222 is employed to filter the cool air Tc. In other examples, additional air filters may be employed and positioned within the section 110 to filter the cool air Tc. The use of multiple filters may reduce the MERV rating that is required for a single air filter.

The mixing shaft or chamber 216 is positioned downstream of the first air inlet 212 and the mixing damper 232. The mixing chamber 232 is configured to create turbulent airflow as the air flows vertically downward through the mixing chamber 232. The turbulent airflow promotes and substantially increases mixing of the exhaust air TH and cool air Tc. Without turbulence in the mixing chamber 216, the airflow may stratify, resulting in a layer of exhaust air TH and cool air Tc with little intermixing between the layers due to temperature based airflow stratification. Stratified airflow may result in drastic temperature differences in the air that is supplied to the computing devices 240 to cool the devices, which may lead to overheating or overcooling some devices. To create turbulent airflow within the mixing chamber 212, the mixing chamber 212 includes a plurality of turbulators or elongate members 218 that project into the mixing chamber 216. The elongate members 218 may be relatively long and thin components that project or extend into the mixing chamber 216. In some examples, the elongate members 218 may be between 2 and 12 feet (approximately 0.5 and 3.5 meters) long, and more commonly between 4 and 10 feet (approximately 1-3 meters) long. The elongate members 218 may also be between 3 and 12 inches (approximately 7.5 and 30.5 centimeters) wide and more commonly between 4 and 8 inches (approximately 10 and 20.5 centimeters). Various other dimensions for the elongate members 218 may also be employed. Each of the elongate members 218 may have a uniform or similar configuration or may have different configurations—either in size and/or orientation within the mixing chamber 216. Differently sized and/or oriented elongate members 218 within the mixing chamber 216 may increase the turbulence that is created within the mixing chamber 216.

In some examples, opposing ends of the elongate members 218 may be attached to opposing, or different walls, within the mixing chamber 216. In such examples, a middle portion of the elongate members 218 may project into the interior of the mixing chamber 216. In other examples, a single end of the elongate member 218 may be attached to a wall of the mixing chamber 216. In such examples, the other end of the elongate member 218 may terminate within the mixing chamber 216. The mixing chamber 216 may include a combination of elongate members 218 that are attached at opposing ends with the walls of the mixing chamber 216 and elongate members 218 that are attached at only one end with a wall of the mixing chamber 216. Similarly, the elongate members 218 may be diagonally oriented within mixing chamber 216 or may have other orientation, such as substantially horizontal. The orientation of the elongate members 218 within the mixing chamber 216 is typically random to increase the turbulent flow of air through the mixing chamber 216. As such, some of the elongate members 218 are commonly more horizontally oriented in comparison with other elongate members 218 within the mixing chamber 216.

The elongate members 218 are passive devices, which means that they are not electrically or mechanically moved within the mixing chamber 216. Rather, they are static objects that are strategically positions to force the air to pass and flow around the objects.

The flow of air around the objects causes turbulent airflow as opposed to laminar airflow, which substantially increases the mixing of the air i.e., cool air Tc and exhaust air Tx within the mixing chamber 216 as the air flows downward and through the mixing chamber 216. In some examples, the exterior surface of the elongate members 218 may be configured to increase the turbulent airflow. For example, the exterior surface may be textured, rough, or otherwise configured to increase skin friction or drag, which may greatly increase the turbulent flow in the mixing chamber 216. In some examples, the mixing chamber 216 may be roughly 8 feet (approximately 2.5 meters) wide per unit length, although the size of the mixing chamber 216 may be varied as desired or required. In some examples, the right side of chamber 216 may be compartmentalized. The elongate member 218 are further configured so that when the mixing damper 232 is closed and the first and second air inlets, 212 and 214, are open, the elongate members 218 do not impede the flow of air through the section.

Figure 6:
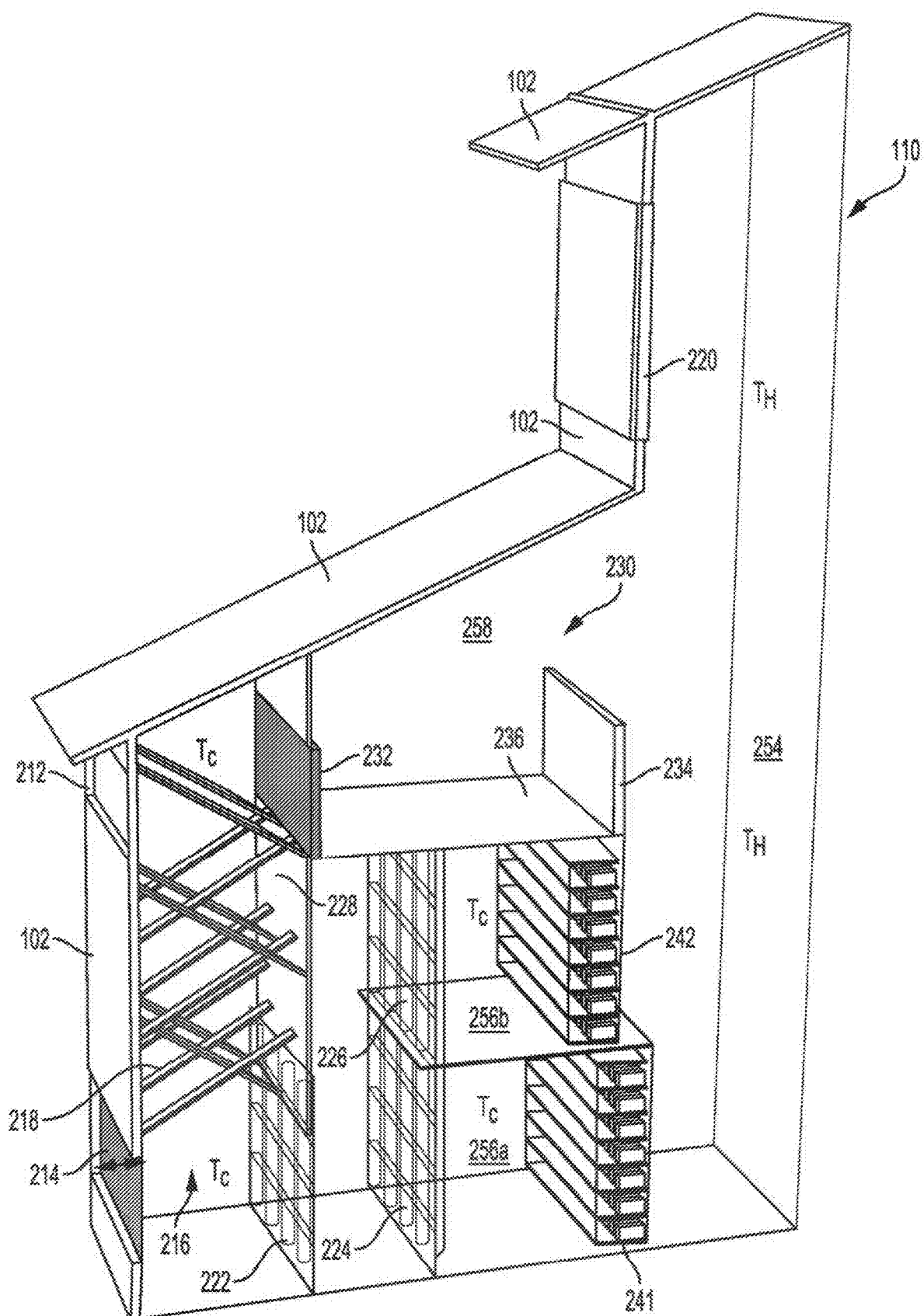
FIG. 6 illustrates another example of a section of the facility of FIG. 1.

Referring now to FIG. 6, illustrated is another example of a section 110 that may be employed within a facility 100. The section 110 is substantially similar to the section 110 illustrated in FIGS. 2 and 3 except that the damper 250 is removed and the section 110 includes two floors of computing devices. Specifically, the section 110 includes a first computing floor 256*a* having a first wall of computing devices 241 and a second computing floor 256*b* having a second wall of computing devices 242. The first computing floor 256*a* is separated from the second computing floor 256*b* by a floor, which may be made of an air permeable material, such as a mesh type material. As such, the cool air Tc is able to flow between the first computing floor 256*a* and the second computing floor 256*b* relatively unobstructed. Additional air filters, 224 and 226, may optionally be positioned to filter the cool air Tc that flows into the first computing floor 256*a* and the second computing floor 256*b*. The additional air filters, 224 and 226, may extend between the floor 236 and the floor of the facility and may be coupled with the floor that separates the first computing floor 256*a* and the second computing floor 256*b*. The additional air filter, 224 and 226, may also be sized and/or configured similar to the air filter 222 e.g., may have a similar MERV rating.

Figure 4:
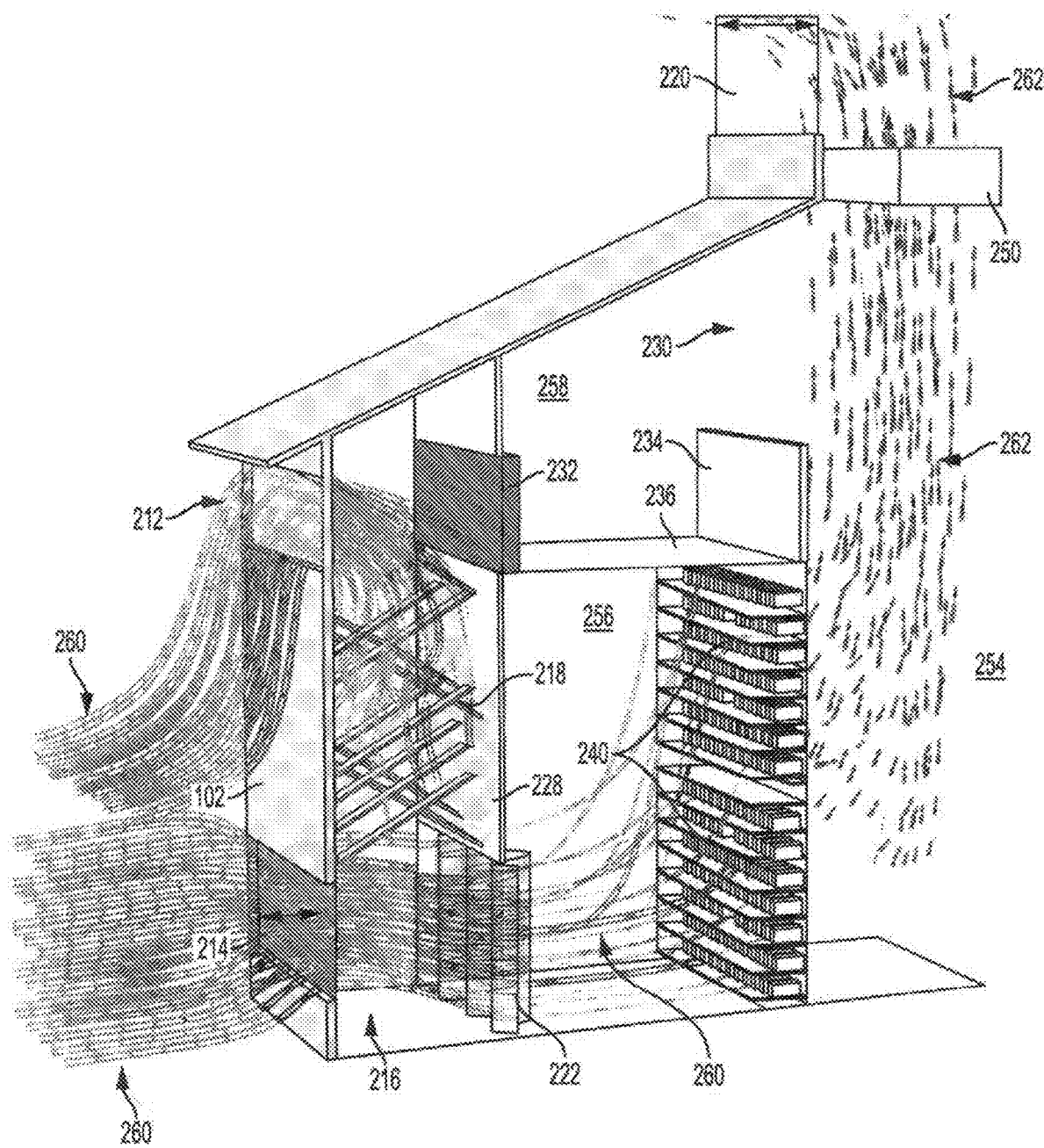
FIG. 4 illustrates an example of airflow through the section of FIGS. 2-3 in which exhaust air is not recirculated within the section.

In some examples, the wall that is formed or defined by the second computing devices 242 (hereinafter second wall) is laterally offset from the wall that is formed or defined by the first computing devices 241 (hereinafter first wall). For example, the second wall may be laterally offset from the first wall by between 6 and 24 inches (approximately 15 and 61 centimeters) and more commonly about 18 inches (approximately 46 centimeters). When a width between the opposing first walls is 12 feet (approximately 3.5 meters) as described above, an offset of 18 inches (approximately 46 centimeters) between the second wall and the first wall would result in a width between the opposing second walls of approximately 15 feet (approximately 4.5 meters). The offset between the first wall and the second wall may be selected as desired and may be used to accommodate an extra volume of heated air that flows upward toward the exhaust outlet 220 from the second walls. While FIG. 6 only illustrates ½ of the section 110, it should be appreciated that the other non-illustrated half typically has a mirrored configuration to the illustrated section. [0045] Referring now to FIG. 4, illustrated is the airflow through the section 110 of FIGS. 2 and 3 in which exhaust air 262 is not recirculated within the section 110. The airflow that is illustrated in FIG. 4 may correspond to a typically airflow through the section 110 in warmer months in which the outside air is cool enough to cool the computing devices 240, but not too cold to require mixing of the heated exhaust air 262 and not to humid to require mixing of the heated exhaust air 262. In the illustration of FIG. 4, the exhaust outlet 220 and/or damper 250 are maintained fully open so that substantially all of the exhaust air 262 is exhausted or vented to the external environment. The exhaust air 262 is illustrated as flowing upward from the computing devices 240 and out of the damper 250 and exhaust outlet 220. The mixing damper 232 is maintained closed so that substantially none of the exhaust air 262 flows into the mixing chamber 216 as illustrated in FIG. 4.

The second air inlet 214 is maintained fully open so that the cool outside air 260 (hereinafter cool air 260) is able flow through both the first air inlet 212 and the second air inlet 214. Each of the air inlets, 212 and 214, are sized so that approximately ½ of the air volume flows through each air inlet. The cool air 260 flows through the air inlets and through the filter 222 to the computing devices 240 where the cool air 260 is warmed by the heat generating components. The heated cool air 260 then flows into the main exhaust air space 254 as exhaust air 262. The airflow through the system is typically driven entirely by the fans of the computing devices 240 as previously described, although in some examples one or more dedicated fans or blowing mechanism may aid in moving the air through the system.

It should be appreciated that FIG. 4 is provided for illustrative purposes and that the second air inlet 214, the exhaust outlet 220, and/or the damper 250 may be incrementally or partially closed so that only some fraction of a maximum airflow of cool air 260 is delivered through the second air inlet 214 and so that some fraction of a maximum airflow of exhaust air 262 is vented from the facility. The mixing damper 232 may likewise be incrementally or partially opened so that some fraction of a maximum airflow of exhaust air 262 is delivered through the mixing damper 232 to the mixing chamber 216 for mixing with the cool air 260 that flows through the first air inlet 212.

The dimensions of the section 110 are typically dependent on the desired or required airflow through the system. For example, the size of the main exhaust air space 254, the size of the air filter 222, and the size of the air inlets, dampers, and outlets are all dependent on the airflow that is expected within the section 110. For example, as described above, the section 110 may be configured to accommodate an airflow of approximately 54,000 CFM, or 27,000 CFM for ½ of the section 110. Given this airflow, the exhaust outlet 220 should be capable of venting or exhausting all of the airflow (e.g., 27,000 CFM at around 500 feet per minute) since in some examples all of the exhausted air will be vented from the facility 100. The exhaust outlet 220 may be roughly 8 feet (approximately 2.5 meters) wide and 7 feet (approximately 2 meters) tall to exhaust this volume of air at the desired air speed.

The first air inlet 212 is typically sized smaller than the exhaust outlet 220 since the volume of air that flows through the first air inlet 212 is typically less than the volume of air that flows through the exhaust outlet 220 due to the use of the second air inlet 214 and/or the mixing damper 232. The first air inlet 212 is commonly an open penetration with a mesh guard and no movable louvers. The first air inlet 212 typically remains open regardless of the external weather conditions, although preparations may exist to close the first air inlet 212 when necessary. The second air inlet 214 is also typically sized smaller than the exhaust outlet 220 since the volume of air that flows through the second air inlet 214 is less than the volume of air that flows through the exhaust outlet 220 due to the use of the first air inlet 212. A cross-sectional area of the exhaust outlet 220 will typically be equal to or larger than a combined cross-sectional area of the first and second air inlets, 212 and 214, or a combined cross-sectional area of the first air inlet 212 and the mixing damper 232 since the volume of air entering and exiting the section 110 must be equal. A cross-sectional area of the first air inlet 212, the second air inlet 214, and the mixing damper 232 is roughly equal since roughly half of the air entering the section 110 is provided by the first air inlet 212 and the other half of the air entering the section 110 is provided by the second air inlet 214, the mixing damper 232, or a combination of the second air inlet 214 and mixing damper 232. A cross-sectional area of the damper 250 is twice the size of the cross-sectional area of the exhaust outlet 220 or larger since the damper 250 is used to vent exhaust air from both sides of the section and to vent exhaust air to a pair of exhaust outlets 220—i.e., the damper 250 accommodates both sides of the section 110. The second air inlet 214 includes louvers, closable vents, or other components that allow the second air inlet 214 to be partially or fully closed to impede or prevent airflow through the second air inlet 214. The louvers may be electronically controlled variable frequency drive components.

The first and second air inlets, 212 and 214, may each be sized so that approximately 50% of the maximum air flow of the exhaust outlet 220 (e.g., 27,000 CFM) is deliverable through each air inlet. Using the example above, approximately 13,500 CFM of airflow may be delivered through the first air inlet 212 and an additionally 13,500 CFM may be delivered through the second air inlet 214. The airflow may be provided at a max air speed of around 421 feet per minute, which is roughly approximate to the max air speed through the exhaust outlet 220. The first and second air inlets, 212 and 214, may be roughly 8 feet (approximately 2.5 meters) wide and 4 feet (approximately 1 meter) tall to deliver this desired air flow.

As briefly described above, the mixing damper 232 may be opened and the second air inlet 214 may be closed to force some of the exhaust air 262 to flow through the mixing damper 232 and into the mixing chamber 216, where it is mixed with the cool air 260. The mixing damper 232 and the second air inlet 214 may be paired so that the degree of closure of the second air inlet's damper may be correlated with the degree of openness of the mixing damper 232. The pairing of the mixing damper 232 and second air inlet 214 allows a desired mixing ratio of cool air 260 and exhaust air 262 to be achieved. In some examples, the mixing damper 232 and the second air inlet 214 are paired in a 1 to 1 ratio so that openness of one component directly corresponds to the closure of the other component. For example, when the mixing damper 232 is 25% open, the second air inlet 214 may be 25% closed and when the mixing damper 232 is 75% open, the second air inlet 214 may be 75% closed. The amount of openness of one component and the amount of closure of the other component may vary by any amount between 0% and 100%. As such, some amount or volume of air may simultaneously flow through the first air inlet 212, the second air inlet 214, and the mixing damper 232.

The damper 250 or exhaust outlet 220 may also be partially closed to increase air pressure within the main exhaust air space 254 and within the recirculated air space 258 and thereby force the exhaust air 262 through the mixing damper 232. In some examples, the degree of closure of the damper 250 or exhaust outlet 220 may be correlated with the degree of openness of the mixing damper 232 and the degree of closure of the second air inlet 214. The damper 250 is typically employed to regulate the airflow through the mixing damper 232. In a specific example, the degree of closure of the damper 250 may be correlated with the degree of openness of the mixing damper 232 so that the damper 250 closes roughly ½ of the amount that the mixing damper 232 opens. This degree of closure of the damper 250 may create the necessary back pressure to develop within the recirculated air space 258 to force the exhaust air 262 to flow through the mixing damper 232 and into the mixing chamber 216. As previously described, the second inlet 214 may also close by the same amount that the mixing damper 232 opens, which likewise aids in forcing the exhaust air 262 to flow through the mixing damper 232 and into the mixing chamber 216. In some examples, the exhaust outlet 220 may be partially or fully closed without opening the mixing damper 232 in order to increase an internal temperature within the section 110 and facility 100.

The mixing damper 232 may be opened to recirculate the exhaust air 262 within the system in order to increase the temperature of the cool air 260, such as during the winter months, or to reduce a humidity in the cool air 260, such as during humid conditions in the warmer months. The mixing damper 232, second air inlet 214, and exhaust damper 220 are typically controlled via a control system (not shown) of the facility 100. The control system includes a processor, memory, and one or more sensors that are configured to sense conditions within the facility 100 and/or external to the facility 100, such as the cool air temperature, the external humidity levels (relative and/or absolute humidity), the internal air temperature, the internal humidity levels (relative and/or absolute humidity), the airflow through the facility, the exhaust gas air temperature, the pressure differential within the system and/or across one or more components, and the like. The sensors communicate this information to the processor and the processor analyzes the information and responds accordingly by opening or closing the various dampers, vents, outlets, and intakes. For example, when the processor determines that the cool air 260 is too cold, the processor responds by sending appropriate instructions to open the mixing damper 232 and simultaneously close the second air inlet 214 and/or exhaust outlet 220. A similar process may occur when the processor determines that the relative humidity in the air is too high. Conversely, when the processor determines that the internal air is too hot and/or the cool air is cool, but not too cold, the processor responds by sending appropriate instructions to close the mixing damper 232 and open the second air inlet 214 and/or exhaust outlet 220. In this manner, the control system is able to modulate the conditions within the facility via information about the cool air and weather conditions and/or via information about the conditions within the facility 100. The control system, including the processor and memory, may be an onsite system that is housed within or near the facility 100 or may be a remote system, such as a cloud computing based system. The control system may monitor one or more facilities and one or more sections within each facility and modulate the conditions within each section and within each facility as needed.

In regards to the mixing damper 232, the mixing damper typically includes electronically controlled louvers that have a variable frequency drive capability. The mixing damper 232 may be sized to vent roughly 60% of the maximum air flow of the exhaust outlet 220 (e.g., 27,000 CFM). The airflow through the mixing damper 232 may be provided at a max air speed of around 500 feet per minute, which is roughly approximate to the max air speed through the exhaust outlet 220. Using the example above of an airflow of 27,000 CFM through the exhaust outlet 220, the mixing damper 232 may be configured to vent approximately 16,200 CFM of air. The mixing damper 232 may be roughly 8 feet (approximately 2.5 meters) wide and 4 feet (approximately 1 meter) tall to deliver this desired air flow.

As briefly described above, the mixing damper 232 may be opened to increase the temperature of the cool air 260 and/or to reduce a relative humidity of the cool air 260. For example, if the outside air temperature is 40 degrees Fahrenheit, the mixing damper 232 may be opened to allow the exhaust air 262 to flow into the mixing chamber 216 and mix with the cool air 260. Regardless of the temperature of the exhaust air 262, the system may expose the cool air 260 to the exhaust air 262 via the mixing damper 216 to achieve a desired treated air condition, such as a temperature that is effective to cool the computing devices to between 60 and 90 degrees Fahrenheit in accordance with ASHRAE TC9.9 environmental standards. The mixing damper 232 may be incrementally closed and/or the second air inlet 214 may be incrementally opened as the outside air temperature nears an ideal cooling temperature, such as a temperature that is effective to cool the computing devices to between 60 and 90 degrees Fahrenheit in accordance with ASHRAE TC9.9. When the outside air temperature reaches the ideal cooling temperature, the mixing damper 232 may be fully closed so that the system is cooled entirely by the outside air. Similarly, as the outside air temperature drops below the ideal cooling temperature, the mixing damper 232 may be incrementally opened and/or the second air inlet 214 may be incrementally closed until the mixing damper is fully opened and/or the second air inlet is fully closed. The relatively humidity in the air may likewise be reduced via the introduction of the exhaust air 262 to the cool air 260. In this manner the humidity of the cool air 260 may be modulated to a level that is in accordance with ASHRAE TC9.9 environmental standards.

Figure 5:
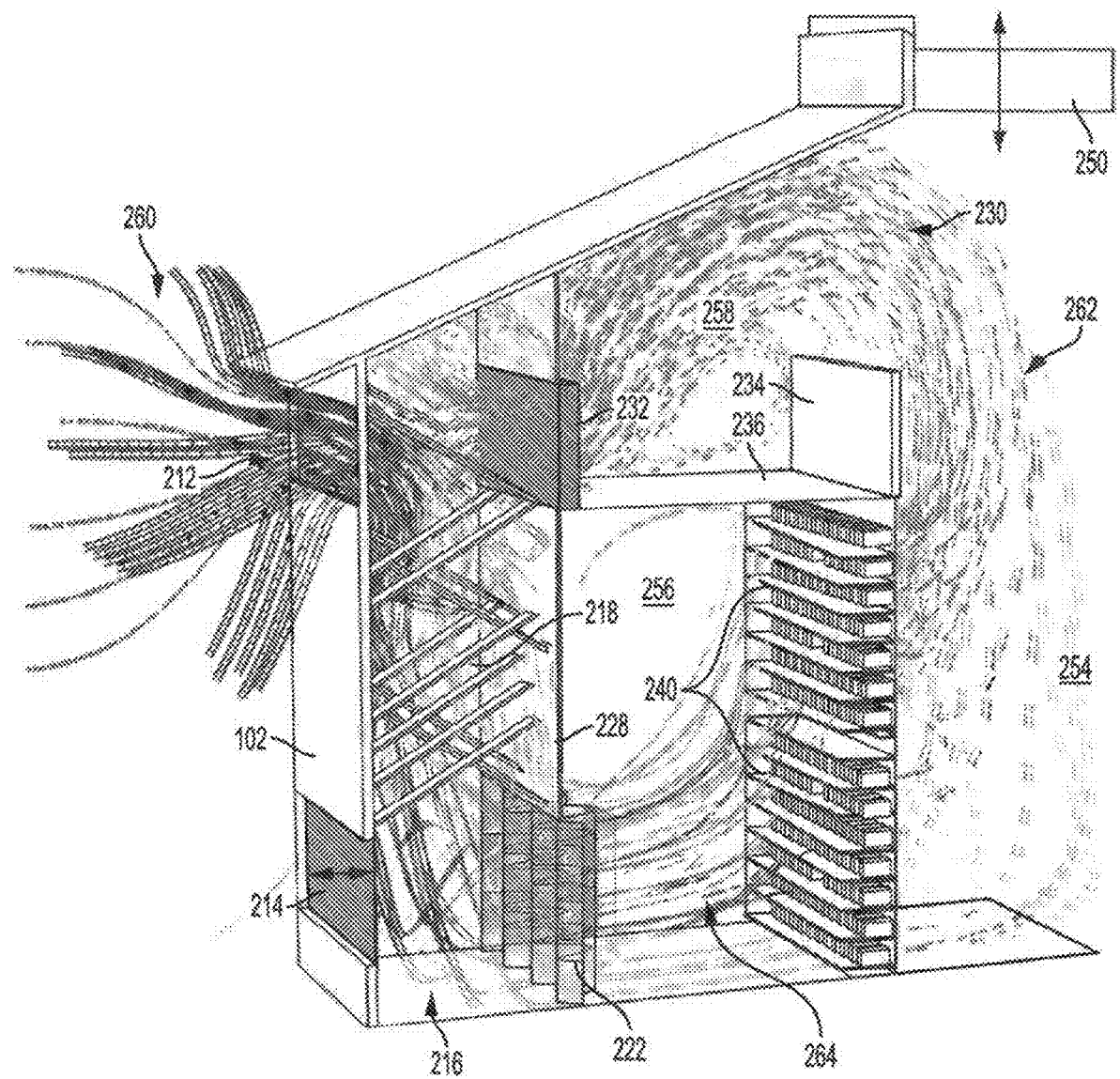
FIG. 5 illustrates an example of airflow through the section of FIGS. 2-3 in which exhaust air is recirculated within the section.

Referring now to FIG. 5, illustrated is the airflow through the section 110 of FIGS. 2 and 3 in which the exhaust air 262 is recirculated within the section 110. The airflow that is illustrated in FIG. 4 may correspond to a typically airflow in the cooler or cold months in which the cool air 260 is too cold to adequately cool the computing devices 240, or in which the cool air 260 is below an ideal cooling temperature. The relative humidity of the cool air 260 is typically not a concern during this time period since the cool air 260 will be warmed by the exhaust air 262. In the illustration of FIG. 5, the exhaust outlet 220 and/or damper 250 are fully closed so that substantially all of the exhaust air 262 flows into the recirculated air space 258 and through the mixing damper, which is illustrated as being fully opened. The exhaust air 262 is illustrated as flowing upward and into the recirculated air space 258 and through the mixing damper 232 into the mixing chamber 216.

The second air inlet 214 is fully closed so that substantially none of the cool air 260 is able flow through the second air inlet 214 and instead is forced to flow through the first air inlet 212. The cool air 260 is forced to flow through the first air inlet 212 so that the cool air 260 and the exhaust air 262 are subjected to the mixing chamber 216 and the elongate members 218, which mixes the cool air 260 and the exhaust air 262 via the passive creation of turbulent flow. If the second air inlet 214 were opened, a substantial portion or volume of the cool air 260 would flow through the second air inlet and may not properly mix with the exhaust air 262. The mixed cool air 260 and exhaust air 262 (hereinafter heated air 264) flows through the air filter 222 to the computing devices 240 where the heated air 264 cools the heat generating components as the heated air 264 flows through the computing devices 240 and into the main exhaust air space 254. The heated air 264 is further heated by the heat generating components and enters the main exhaust air space 254 as exhaust air 262. The airflow through the system is typically driven entirely by the fans of the computing devices 240 as previously described, although in some examples one or more dedicated fans or blowing mechanisms may aid in moving the air through the system.

As previously described, it should be appreciated that FIG. 5 is provided for illustrative purposes and that the second air inlet 214, the exhaust outlet 220, and/or the damper 250 may be incrementally or partially opened so that some fraction of a maximum airflow of cool air 260 is delivered through the second air inlet 214 and so that some fraction of a maximum airflow of exhaust air 262 is vented from the facility. The mixing damper 232 may likewise be incrementally or partially closed so that some fraction of a maximum airflow of exhaust air 262 is delivered through the mixing damper 232 to the mixing chamber 216 for mixing with the cool air 260 that flows through the first air inlet 212. Thus, the flow of cool air 260, exhaust air 262, and heated air 264 through the system may include any incremental airflow percentage or volume between the illustrations of FIG. 4 and FIG. 5 as a person of skill in the art will readily understand.

Figure 7:
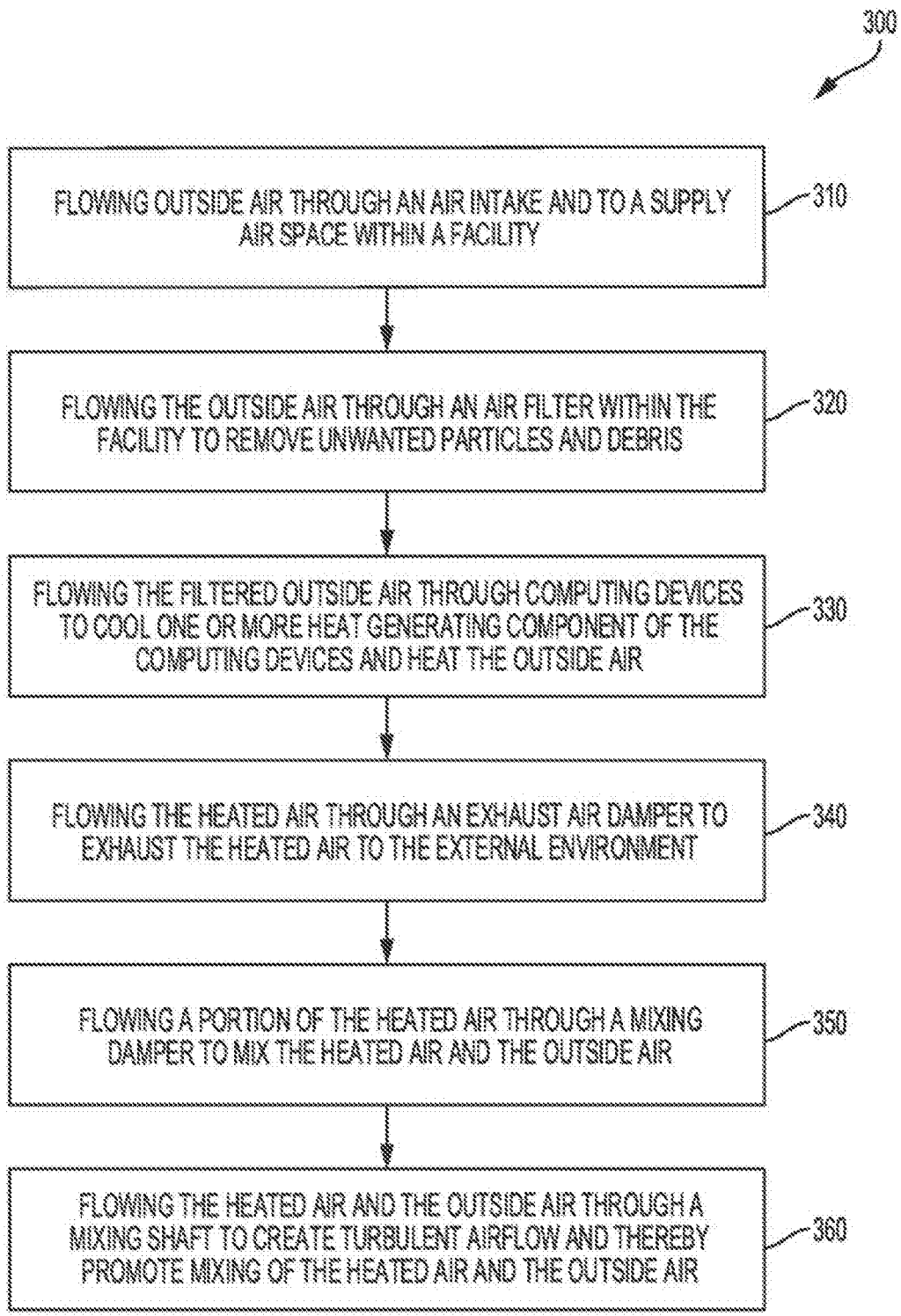
FIG. 7 illustrates a method of cooling computing devices within a facility.

Referring now to FIG. 7, illustrated is a method 300 of cooling computing devices within a facility. As described herein, the facility has an interior space that includes a supply air space and an exhaust air space. At block 310, outside air flows from an external environment, through an air inlet of an exterior wall of the facility, and to the supply air space within the facility. At block 320, the outside air flows through an air filter assembly within the facility to filter the outside air and thereby remove unwanted particles and debris from the outside air. At block 330, the filtered outside air flows through a plurality of computing devices in order to cool one or more heat generating component of the computing devices. The computing devices are arranged within the interior space of the facility so that the computing devices partition at least a portion of the supply air space from the exhaust air space. In some examples, most or all of the computing devices include a fan that is capable of moving the filtered outside air across the one or more heat generating components to cool the heat generating components and heat the filtered outside air. The heated air flows into the exhaust air space from the computing devices. At block 340, the heated air flows through an exhaust air damper to exhaust the heated air from the exhaust air space to the external environment. The airflow of the outside air and the heated air is substantially driven by the combined airflow of a plurality of the fans of the computing devices as described herein.

At block 350, at least a portion of the heated air flows through a mixing damper that is positioned within the interior space of the facility between the supply air space and the exhaust air space. The heated air flows through the mixing damper to enable mixing of the heated air and the outside air supplied through the air inlet. As described herein, block 350 is an optional step that may be used to increase the temperature of the outside air and/or reduce the relative humidity of the outside air. The interior space of the facility may include a hot air space, or recirculated air space, that is positioned vertically above the computing devices. The hot air space may be in fluid communication with the exhaust air space so that heated air is flowable from the exhaust air space into the hot air space. The mixing damper may be positioned on an exterior end of the hot air space. In such examples, the method 300 may also include closing the exhaust air damper and opening the mixing damper to control an amount of heated air that flows through the mixing damper and mixes with the outside air. The facility may include two air inlets that are each configured to supply outside air to the supply air space from the external environment. A second air inlet may be positioned vertically below a first air inlet. In such examples, the method 300 may further include closing a damper of the second air inlet to increase an amount of outside air that flows through the first air inlet and mixes with the heated air that flows through the mixing damper.

At block 360, the outside air and the heated air flow through a mixing shaft or chamber to create turbulent airflow and thereby promote mixing of the outside air and the heated air. Block 360 is an optional step that is conditioned on the occurrence of block 350. The mixing shaft may include a plurality of elongate members that project into the mixing shaft to create the turbulent airflow. The mixed outside air and heated air may flow through an air filter that is coupled with a bottom end of the mixing shaft and with a floor of the facility.

The computing devices may be arranged within the interior space of the facility to form a wall that partitions the supply air space and the exhaust air space. The wall may be two stories tall and/or the facility may include at least two floors of computing devices. As described herein, the facility may include two air inlets that are each configured to supply outside air to the supply air space from the external environment. A second air inlet may be positioned vertically below a first air inlet. In such examples, the method 300 may further include flowing outside air through the first air inlet and through the second air inlet into the supply air space. A combined airflow through the first air inlet and through the second air inlet may be approximately equal to the airflow through the exhaust air damper.

FIGS. 8 through 13 represent additional exemplary illustrations of systems that also allow for efficient passive passage of ambient air through computing devices disposed between a computing space and an exhaust airspace, capable of relying exclusively on the exhaust fans of the computing devices themselves to circulate the air between the computing space and the exhaust airspace. Yet, the airflow volume and temperature difference between the ambient air in the computing space and the exhaust airspace are both sufficient to adequately cool the computing devices.

The system may include at least one facility that forms some type of housing including, but not limited to, a building, a warehouse, a trailer, an awning, a lean-to, a container (e.g., a shipping container), or a storage unit. In some approaches, the facility may not include all of the elements, components, structures, spaces, etc. of the facility 100 (e.g., sections 110, recirculated hot air space 258, mixing damper 232, etc.).

An example facility 400 may be a building, a warehouse, or other conceivable housing structure as described above. The facility 400 may have the same or similar dimensions (e.g., length, width, height) as the facility 100 and may be oriented relative to the environment and/or other adjacent facilities the same as or similar to the facility 100. The facility 400 may include a plurality of exterior walls 402 that define the exterior surface of the structure and may also include one or more interior walls 428.

The facility 400 may include at least one cool air aisle 406, at least one hot air aisle 408, a plurality of computing devices 440, at least one air inlet 412, and at least one exhaust outlet 420. The facility 400 may be free of any other air moving device, such as a dedicated fan or blowing mechanism, and an airflow through the system and facility 400 may be driven entirely by the fans of the computing devices 440 arranged therein. While the cool air aisles 406 and the hot air aisles 408 of facility 400 are configured differently from one another illustrating various configurations and features, the cool air aisles 406, the hot air aisles 408, and the features thereof may be rearranged and/or combined to produce ant desired configuration. Additionally and/or alternatively, at least some of the cool air aisles 406 may be structured identically and/or at least some of the hot air aisles 408 may be structured identically.

Unlike the cool air aisles in the examples shown in FIGS. 2-6, the exemplary cool air aisles 406 are not partitioned or divided into a mixing chamber 216 and a computing space 256. Each cool air aisle 406 is an area or space in which cool air Tc from the external environment is present. Each cool air aisle 406 may be fluidically connected to at least one hot air aisle 408 and the external environment.

Each of the cool air aisles 406a, 406b, 406c, 406d may be disposed completely within the facility 400 and may be disposed between two adjacent hot air aisles 408. The cool air aisles 406 may each be defined by three interior walls 428 and one exterior wall 402 which extend between the floor of the facility 400 and the ceiling of facility 400. While not illustrated, one or more of the cool air aisles 406 may alternatively be defined by any combination of interior walls 428, exterior walls 402, floors, and ceilings and/or may be defined by another surface or structure disposed within the facility 400.

In contrast to the hot air aisles in the examples shown in FIGS. 2-6, the exemplary hot air aisles 408 are not partitioned or divided into a main exhaust air space 254, a recirculated hot air space 258, and a vent air space 252. Each hot air aisle 408 is a space, area, and/or environment into which the exhaust air Tx is expelled after passing through, and being heated by, the computing devices 440. Each hot air aisle 408 may be fluidically connected to at least one of the cool air aisles 406 and/or at least one other hot air aisle 408.

Each of the hot air aisles 408a, 408b, 408c, 408d, 408e, 408f is disposed completely within the facility 400 adjacent to the cool air aisles 406. Each of the hot air aisles 408 is defined by at least one interior wall 428 and at least one exterior wall 402 which extend between the floor of the facility 400 and the ceiling of facility 400. Hot air aisle 408a, 408b, 408c, 408d, 408e are each defined by two or more interior walls 428 and one exterior wall 402. Hot air aisle 408f is defined by one interior wall 428 and two exterior walls 402. Although not depicted in FIG. 8, at least one of the hot air aisles 408 may be defined by any combination of interior walls 428, exterior walls 402, floors, and ceilings, including solely by interior walls 428 extending between the floor of the facility 400 and the ceiling of the facility 400, and/or may be defined by another surface or structure disposed within the facility 400.

The hot air aisles 408 may be structured and arranged such that the computing devices 440 of adjacent cool air aisles 406 are sufficiently spaced from one another to prevent an overheating of the computing devices 440. For example, at least one of the hot air aisles 408 may be at least 15 feet (approximately 4.5 meters) wide (e.g., a distance of the hot air aisle 408 extending between adjacent cool air aisles 406 is at least 15 feet or approximately 4.5 meters) and may be at least 14 feet (approximately 4 meters) tall. Hot air aisles 406 with these dimensions provide able space therein to receive and efficiently dissipate the exhaust air TH and, if disposed between adjacent cool air aisles 406, provide sufficient space between the opposing computing devices 440 of the adjacent cool air aisles 406 such that the flows of exhaust air TH dispelled therefrom do not significantly interfere with one another. Conceivably, at least one of the hot air aisles 408 may have dimensions similar to the main exhaust air space 254 described above and, thus, may be between 5 and 20 feet (approximately 1.5 and 6 meters) wide and may be between 15 and 50 feet (approximately 4.5 and 15 meters) tall.

The walls 402, 428 of the facility 400, the ceiling of facility 400, and/or the floor of the facility 400 may define a cool air aisle 406 and/or a hot air aisle 408. At least one of the walls 402, 428, the floor of the facility 400, and/or the ceiling of the facility 400 may be thermally insulated. In some examples, at least one of the walls 402, 428, the floor of the facility 400, and/or the ceiling of the facility 400 may be thermally insulated by one or more thermal insulation layers arranged thereon, which may optionally cover an entirety of the surface. The walls 402, 428, the ceiling, and/or the floor may also be configured to fluidically seal a defined cool air aisle 406 and/or a defined hot air aisle 408 from at least one other surrounding area, such as an adjacent hot air aisle 408, an adjacent cool air aisle 406, or another area within the facility 400. In one such example, the cool air aisle 406 and/or hot air aisle 408 may be defined such that the cool air Tc or the exhaust air TH contained therein, respectively, may essentially flow in or out of the aisle only through a computing device 440, an air inlet 412, and/or an exhaust outlet 420. Additionally, some of the walls 402, 428 may be formed by the computing devices 440, by one or more air inlets 412, and/or by one or more exhaust outlets 420.

A plurality of computing devices 440 may be arranged within at least one of the cool air aisles 406. In some examples, a plurality of the computing devices 440 is arranged within each of the cool air aisles 406. The facility 400 may include tens of thousands of computing devices 440. The number of computing devices 440 arranged within a facility 400 and/or within a single cool air aisle 406 may be dependent upon the amount of electrical power available at the facility 400, the amount of electrical power available within a cool air aisle 406, and/or the amount of electricity required to operate the plurality of computing devices 440. In one specific example, a facility 400 and/or individual cool air aisle 406 may have 12 MW of available electrical power and each computing device 440 may require 1450 W to operate, thus 8,275 computing devices 440 may be arranged within the facility 400 and/or the individual cool air aisle 406 to fully utilized the available electrical power and maximize production of the facility 400.

At least some of the computing devices 440 include a fan or multiple fans capable of moving the cool air Tc across one or more heat generating components of the computing devices 440 to cool the heat generating components. In some exemplary illustrations, most of the computing devices 440, or all of the computing devices 440, include a fan that moves the cool air Tc across the heat generating component(s). In some examples, the fan(s) of a respective computing device 440 may be a stock fan(s) (i.e., the original fan(s)) provided with and/or integrated within the computing device 440 by the manufacturer and/or as purchased from a retailer or supplier. The computing device fans may each be configured to move approximately 150 CFM (cubic feet per minute) of air. Each of the computing devices 440 may be operated independently of one another. In this manner, the computing devices 440 within one of the cool air aisles 406 may operate irrespective of the other computing devices 440 within that same cool air aisle 406 or any other cool air aisle 406. The computing devices 440 may be oriented and/or arranged relative to one another and/or in relation to the walls 402, 428 such that the cool air Tc within the respective cool air aisle 406 is able to pass through at least some of the computing devices 440 and into a hot air aisle 408, but a backflow of exhaust air Tx through the computing devices 440 is substantially prevented or negligible. As such, the computing devices 440 may fluidically connect a cool air aisle 406 and a hot air aisle 408 to one another.

The computing devices 440 may be coupled to, mounted on, integrated within, and/or arranged adjacent to or in abutment with one or more of the walls 402, 428. The computing devices 440 may also be structured and arranged to form one or more of the walls 402, 428. The computing devices 440 may be arranged vertically above one another in columns and/or laterally next to one another in rows and may be arranged along any length and/or any height of the wall 402, 428. The computing devices may also be arranged in an array or grid-like manner to maximize the number of computing devices 440 which may be arranged in a given area. In some illustrations, the computing devices 440 may be arranged in an array extending along an entire length and/an entire height of the wall 402, 428 to maximize the amount of computing devices 440 which may be arranged along a wall 402, 428. The computing devices 440 may also be arranged along a wall 402, 428 continuously or in sections. One or more of the sections of computing devices 440 may be structured as or form part of a device bay 472. In one example, a device bay 472 may include a rack or shelf on which one or more columns of computing devices 440 and/or one or more rows of computing devices 440 are arranged.

In some examples, the computing devices 440 may be arranged in close proximity to one another. Grouping multiple heat outputting computing devices 440 closer together would expectedly make it harder to keep the computing devices 440 cool due to the additional heat output from the adjacent computing devices 440. However, in practice, the close arrangement of computing devices 440 increases flow of the cool air Tc to the area, due to the increased draw from their collective fans, and provides surprisingly efficient cooling of the computing devices 440 without requiring any supplemental airflow and/or supplemental cooling system. Moreover, computing devices 440 arranged in close proximity are even able to collectively provide or generate a strong enough draw and flow of cool air Tc for sufficient cooling utilizing only their original or stock fans. Thus, even though each computing device 440 generates substantial heat, it has been determined that collectively, stock fans of each device provides adequate cooling in the disclosed arrangements when the airflow of the fans are additively combined as discussed. Additionally, the computing devices 440 may be arranged within a cool air aisle 406 such that air passes through their respective air throughflow passages 476 and into a hot air aisle 408 in a direction transverse to the direction air enters the cool air aisle 406 through the air inlets 412. In some examples, the computing devices 440 may be arranged within a cool air aisle 406 such that air may pass through the respective air throughflow passages 476 and into a hot air aisle 408 in a direction perpendicular to the direction air enters the cool air aisle 406 through the air inlets 412. The transverse directions of airflow through the computing devices 440 and air inlets 412 provides a beneficial flow of air throughout the cool air aisle 406.

At least one of the computing devices 440 may run hotter than other computing devices 440 and, thus, output more heat. The computing devices 440 which output a greater amount of heat may be arranged vertically above other computing devices 440 which output less heat. Surprisingly, arranging the hotter running computing device 440 vertically above other computing devices 440 which output heat of a lower temperature allows for an easier and more efficient cooling of the hotter running computing device 440. This goes against conventional wisdom since the heat from the other heat outputting computing devices 440 would rise to the area around the hotter running computing device 440, which would expectedly make it more difficult to cool.

At least one of the computing devices 440 may be fluidically connected to a hot air aisle 408 and/or a cool air aisle 406 by one or more device cowls 470. The device cowls 470 may conceivably be any structure which can form a sealed fluidical connection, such as an air duct, pipe, or tube. At least one of the device cowls 470 may be coupled to one or more of the computing devices 440 at one end and coupled to one of the walls 402, 428, the ceiling, or the floor of the facility 400 at the other. The device cowls 470 may also be integrated within and extend through one or more of the walls 402, 428. Multiple device cowls 470 may be disposed within a single wall 402, 428. In some examples, a plurality of device cowls 470 may be fluidically connected to one another allowing the different flows of exhaust air Tx flowing within the device cowls 470 to be combined and expelled into a hot air aisle 408 via one or more common cowl outlets. In some examples, such as where the computing devices 440 are integrated within a wall 402, 428 or form a wall 402, 428, the computing devices 440 may directly fluidically connect the cool air aisle 406 with the hot air aisle 408 (i.e., without any device cowl(s) 470) via an air throughflow passage 476 extending through the respective computing device 440.

Within the cool air aisle 406a, computing devices 440a are mounted to the interior wall 428 along its entire length and height. The cool air aisle 406a is fluidically connected to the hot air aisle 408a by the computing devices 440a. The computing devices 440a are each fluidically connected to the hot air aisle 408a by a plurality of device cowls 470a. The device cowls 470a are connected to the computing devices 440a at one end such that the device cowls 470a fluidically communicate with the air throughflow passages 476 of the computing devices 440a. The devices cowls 470a are integrated within the interior wall 428 and at least partially extend therein along a direction of the interior wall 428. The device cowls 470a are fluidically connected to one another such that the flows of exhaust air TH within the device cowls 470a are combined within the interior wall 428 and expelled into the hot air aisle 408a via multiple common cowl outlets. The computing devices 440a' are arranged within device bays 472 and disposed along sections of the other interior wall 428 of the cool air aisle 406a. The computing devices 440a' are coupled to the interior wall 428 establishing a fluidically connection with the device cowls 470a' integrated within the interior wall 428. In contrast to the device cowls 470a, device cowls 470a' are fluidically separate from one another, extend transversely through the interior wall 428, and each individually expel the exhaust air TH into the hot air aisle 408b.

Within the cool air aisle 406b, the computing devices 440b, 440b' are integrated into a respective interior wall 428. The computing devices 440b directly fluidically connect the cool air aisle 406b to the hot air aisle 408b, while the computing devices 440b' directly fluidically connect the cool air aisle 406b to the hot air aisle 408c (i.e., without any device cowls 470).

In the cool air aisle 406c, the computing devices 440c are arranged to form the interior walls 428 which define the cool air aisle 406c. The computing devices 440c directly fluidically connect the cool air aisle 406c to the hot air aisles 408d, 408e.

The cooling air aisle 406d is not being utilized and/or operated. As such, no computing devices 440 are arranged in the cooling air aisle 406d. However, the cooling aisle 406d may be configured and fully equipped for operation such that computing devices 440 may be arranged within the cooling air aisle 406d and the cooling air aisle 406d operated if desired.

To prevent the backflow of exhaust air TH through computing devices 440 that may not be operating, some illustrations may include one or more sealing mechanisms 474 which substantially fluidically seal an associated air throughflow passage 476 of one or more of the computing devices 440. In some examples, one or more of the sealing mechanisms 474 may be a flap or valve that covers an opening of the air throughflow passage 476 of one or more computing devices 440. The sealing mechanisms 474 may be formed as a part or portion of another structure or be provided as a separate component. In other examples, one or more of the sealing mechanisms 474 may be integrated within one of the computing devices 440. One or more of the sealing mechanisms 474 may be actively actuated, such as by a controller or computer. Additionally and/or alternatively, one or more of the sealing mechanisms 474 may be actuated passively by the flow of air through the air throughflow passage 476. In other words, the sealing mechanism 474 opens when there is a flow of air through the air throughflow passage 476 and closes when there is no flow of air. The sealing mechanisms 474 may be jointly and/or individually actuated and may be disposed in at least one cool air aisles 406 and/or in at least one hot air aisles 408. In some illustrations, the sealing mechanisms 474 close the air throughflow passages 476 of individual computing devices 440 which are not in operation.

Figure 9:
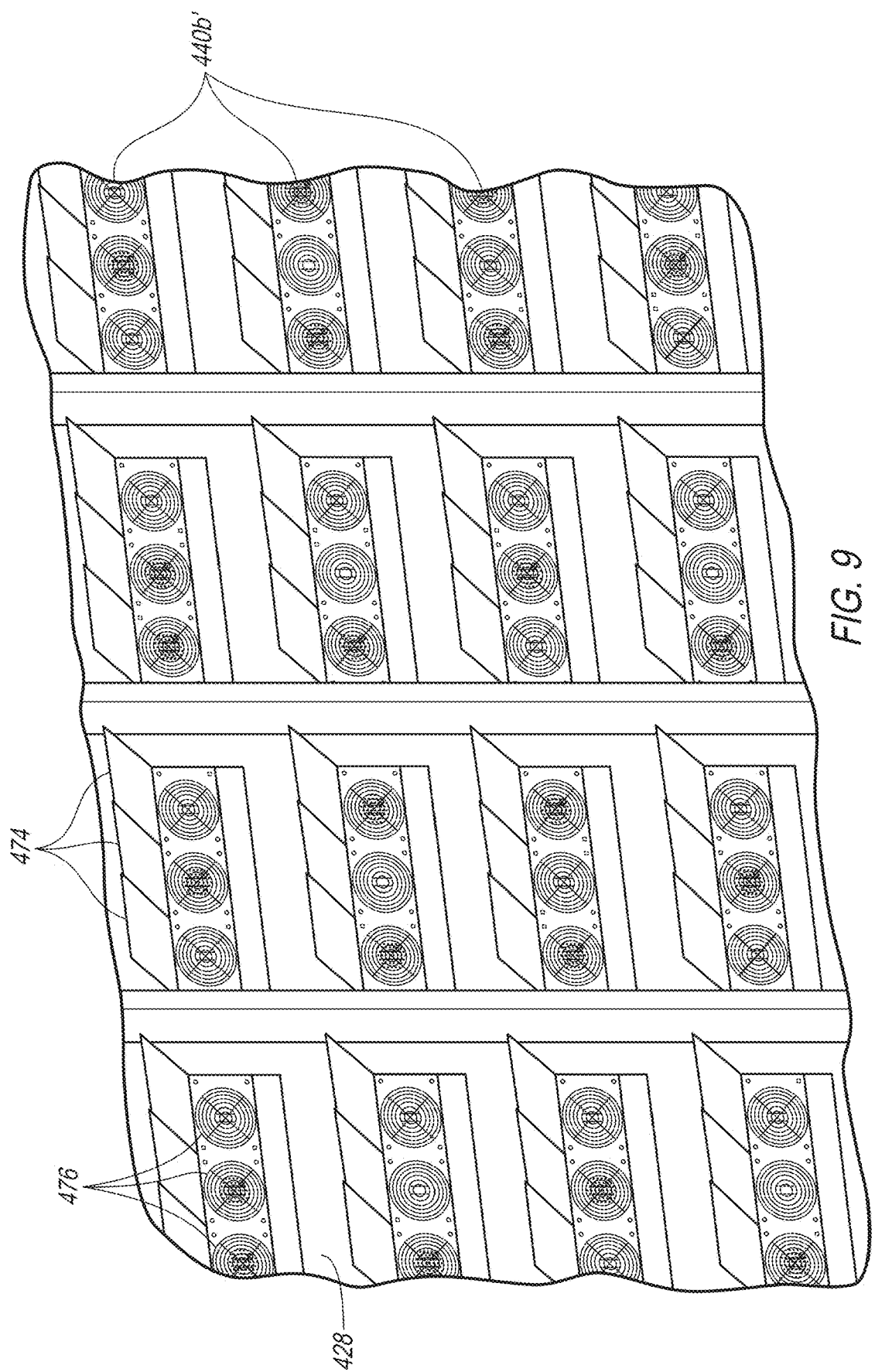
FIG. 9 illustrates an example of a wall of the facility of FIG. 8 in which a plurality of computing devices are integrated as viewed from within a hot air aisle.

The interior wall 428 in which the computing devices 440b' are integrated as viewed from within the hot air aisle 408c is depicted in FIG. 9 as well as sealing mechanisms 474. The computing devices 440b' are integrated within the interior wall 428 in rows extending along the entire length of the interior wall 428 and in columns extending along the entire height of the interior wall 428. The interior wall 428 includes thermal insulation around the computing devices 440b', and at least around the rear surface of each of the computing devices 440b'. A sealing mechanism 474 structured as a passively actuated flap formed by an extension or protrusion of the interior wall 428 and/or an insulation layer arranged on the interior wall 428 is associated with a respective air throughflow passage 476 of the computing devices 440b'. Each of the computing devices 440b' are in operation and, thus, the sealing mechanisms 474 are in an open position. Should one or more of the computing devices 440b' stop operating, the sealing mechanism 474 will actuate into the closed position to cover at least a portion of the rear surface of one of the computing devices 440b' closing the associated air throughflow passage 476.

Each hot air aisle 408 may include one or more exhaust outlets 420 configured to expel exhaust air Tx to the external environment. One or more hot air aisles 408 may be directly fluidically connected to the external environment via at least one exhaust outlet 420. At least one of the exhaust outlets 420 may include louvers or other controls to open and/or close the exhaust outlets 420. An exhaust outlet 420 may be structured as a ceiling vent 420a disposed in the ceiling of the facility 400 or as a wall vent 420b disposed in a wall 402, 428 of the facility 400. As shown, the hot air aisles 408a, 408b, 408c each include one or more exhaust outlets 420 structured as a wall vent 420b. In some examples, the wall vent 420b may be disposed in an upper portion of an exterior wall 402. Placement of the exhaust outlets 420 in the ceiling or an upper portion of a wall 402, 428 allows convection to aid in the expulsion of the exhaust air TH and also prevents an unwanted mixing of the exhaust air TH expelled therefrom with cool air Tc in the external environment which may be drawn into a nearby cool air aisle 406. The hot air aisles 408b, 408c also include an exhaust outlet 420 structured as a ceiling vent 420a disposed in the ceiling of the facility 400. The hot air aisles 408d, 408e, 408f do not include any exhaust outlets 420, but are each fluidically connected to the hot air aisle 408c. As such, hot air aisles 408d, 408e, 408f are indirectly fluidically connected to the external environment through the hot air aisle 408c.

Figure 10:
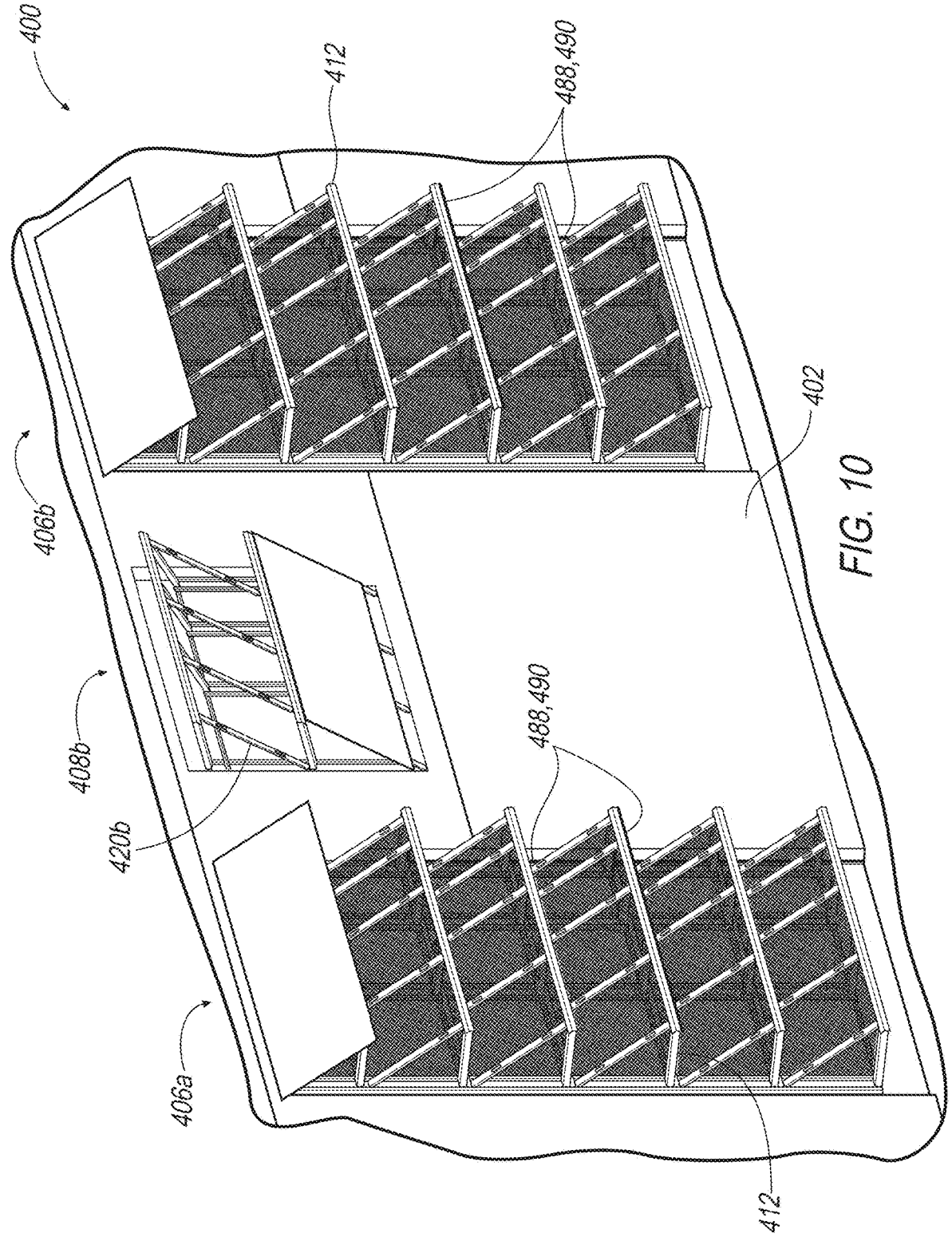
FIG. 10 illustrates an example of an exterior wall of a facility of FIG. 8 in which an air inlet and an exhaust outlet are integrated.

Each cool air aisle 406 may include one or more air inlets 412 through which cool air Tc is supplied to the respective cool air aisle 406. The air inlets 412 may each be integrated within an exterior wall 402 defining the respective cool air aisle 406 and, thus, form a portion of the exterior wall 402. Conceivably, one or more of the air inlets 412 may also be arranged on and/or connected to the exterior wall 402 by other methods or structures. At least one of the air inlets 412 may also be disposed on an interior wall 428, the floor of the facility 400, and/or the ceiling of the facility 400 (not depicted). The air inlets 412 may be structured to extend across a majority of the exterior wall 402 to maximize air flow into the cool air aisle 406 as can be seen in FIG. 10. However, the air inlets 412 may be of any desired size and shape. In one specific example, at least one of the exterior walls 402 defining a cool air aisle 406 may be formed completely by one or more air inlets 412.

At least one of the air inlets 412 may include a static louver, mesh screen, or other component that prevent animals or debris from entering the cool air aisle 406. In some examples, each of the air inlets 412 includes a static louver, mesh screen, or other component. As illustrated in FIG. 10, the air inlets 412 of the cool air aisles 406a, 406b each include screens structured to form triangular screen bodies projecting outwardly from the exterior wall 402. Forming the screens into triangular shaped screen bodies allows for the screens to block debris, such as leaves and rain, without substantially interfering with the flow of cool air Tc into the cool air aisles 406. At least one of the air inlets 412 may also include an airflow control mechanism, such as a damper or closable vent, configured to open and close the air inlet 412 as desired. Additionally and/or alternatively, at least one of the air inlets 412 may remain open regardless of the external weather conditions.

Each of the cool air aisles 406 include a filter wall 478 arranged therein, however this is not required. The filter wall 478 is configured to distribute and filter the cool air Tc that passes through the air inlets 412. The filter wall 478 may be arranged near or adjacent to the air inlets 412 such that cool air Tc passes through the filter wall 478 prior to flowing through the computing devices 440. The filter wall 478 may be structured as or include one or more filters similar to the air filter 222. For example, the filter wall 478 may include an accordion or pleated filter, which maximizes the available surface area for filtering the cool air Tc and minimizes the pressure drop or loss across the filter wall 478. Since the airflow through the system is dependent entirely on the combined airflow of the fans of the computing devices 440, minimizing the pressure drop across the filter wall 478 is more important than in conventional systems that have dedicated high output fans or blower mechanisms. A filter wall 478 that is designed to remove debris or particles too small may overly burden the fans of the computing devices 440, which may cause the computing devices 440 to prematurely fail. A filter wall 478 with a minimum efficiency reporting value (MERV) rating of between 11 and 13 has been found to provide a sufficient degree of air filtering and an acceptable pressure drop. Accordingly, the filter wall 478 may have a MERV rating of between 11 and 13.

The filter wall 478 is structured as a vertical wall having a base section 480 and two leg sections 482 which, together with the air inlets 412, form a substantially trapezoidal shape in a view from above. In some approaches a base portion adjacent base section 480 is generally rectangular in cross-section, before transitioning to a substantially trapezoidal shape in cross section. A rectangular base portion may be helpful when utilizing element 484, as discussed in more detail below. The filter wall 478 having the trapezoidal shape provides an advantageous flow and distribution of cool air Tc within the cool air aisle 406. The base section 480 of the filter wall 478 is disposed a distance from the air inlets 412 and/or the exterior wall 402. The base section 480 may extend in substantially parallel manner to the exterior wall 402 and may extend a shorter distance than the air inlets 412 to form the short base portion of the trapezoidal shape. The two leg sections 482 of the filter wall 478 may be connected to opposite sides of the base section 480 and extend non-perpendicularly toward the air inlets 412 and/or the exterior wall 402. The two leg sections 482 may be connected to opposite sides of the air inlets 412 such that the air inlets 412 define the long base portion of the trapezoidal shape. In other examples, the two leg sections 482 may be connected to the exterior wall 402 on opposite sides of the air inlets 412, or may not contact the air inlets 412 or the exterior wall 402 at all. The width and height of the filter wall 478 may be varied depending on a desired pressure drop, with larger cross-sectional areas of the filter wall 478 resulting in a lower pressure drop. To maximize air flow into the cool air aisle 406, the filter wall 478 may have a height equal to or larger than a height of the air inlets 412. It is envisioned that, in other examples, the filter wall 478 may be any size and shape and may be arranged within the cool air aisle 406 in any manner so long as the filter wall 478 does not significantly impinge the flow of cool air Tc into the cool air aisle 406 as explained above.

A distributor wall 484 is arranged within each of the cool air aisles 406 to deflect cool air Tc drawn through the air inlets 412 to a desired area of the cool air aisle 406. In some examples, the distributor wall 484 may be arranged within the area defined by the trapezoidal shaped filter wall 478. However, a distributor wall 484 does not need to be arranged within each cool air aisle 406. Each distributor wall 484 may include several portions arranged at an angle to air inlets 412, to the airflow direction passing through the air inlets 412, and/or to one another to deflect the airflow passing through the air inlets 412 to a desired area within the cool air aisle 406. In some examples, the distributor wall 484 may form a wedge-like shape pointing toward the air inlets 412. As shown, the wedge-shaped distributor wall 484 is arranged proximal the air inlets 412 and the sections are oriented such that at least some of the cool air Tc passing through the air inlets 412 impacts the distributor wall 484 and is deflected toward the computing devices 440 arranged adjacent to the air inlets 412. In this manner, the distributor wall 484 more evenly distributes the cool air Tc within the cool air aisle 406 and ensures a sufficient flow of fresh cool air Tc to the computing devices 440 arranged in areas which may experience lower rates of air flow. This redirection may also ensure that the computing devices 440 within high flow areas of the cool air aisle 406 receive airflow at an optimum speed and/or volume by redirecting some of the airflow away for the computing devices 440 in the high flow areas thereby reducing the rate, speed, and/or volume of airflow to the high flow areas. The distributor wall 484 may conceivably have any desired size and shape so long it does not significantly impede the flow of cool air Tc into the cool air aisle 406.

A plurality of blocking walls 486 are disposed within the hot air aisle 408*b* separating the outflow of exhaust air TH from the computing devices 440*a*' and 440*b*. Each blocking wall 486 is arranged in alignment with an associated section of the computing devices 440*a*' and/or an associated device bay 472, and are sized and shaped in a complimentary manner to the associated computing devices 440*a*' and/or device bay 472. Exhaust air TH leaving the associated computing devices 440*a*', thus, impacts the blocking wall 486 and is then driven by the fans of the computing devices 440*a*' out of the hot air aisle 408*b* through the exhaust outlets 420 including the ceiling vent 420*a* and/or the wall vent 420*b*. As such, the blocking walls 486 prevent the outflow of exhaust air TH from computing devices 440*a*' from impacting the backside of the computing devices 440*b* and interfering with the outflow of exhaust air TH therefrom, and vice versa.

In other examples, one or more blocking walls 486 are arranged within each hot air aisle 408. The blocking walls 486 may be disposed in a hot air aisles 408 in alignment with one or more associated outflows of exhaust air TH from the computing devices 440 and/or the device cowls 470 such that the associated outflows of exhaust air TH impact the blocking wall 486. In this manner, the blocking walls 486 prevent an outflow of exhaust air TH from one group of computing devices 440 from interfering with an opposing outflow of exhaust air TH from another group of computing devices 440. As such, the distance between opposing groups of computing devices 440 needed to prevent interference between the opposing outflows of exhaust air TH within the hot air aisle 408 can be reduced, allowing the hot air aisles 408 to have smaller dimensions. Consequently, the space encompassed by the system may be more efficiently utilized and may increase the overall production of the facility. For example, a facility 400 utilizing blocking walls 486 may have narrower hot air aisles 408 and, thus, can house an increased number of hot air aisles 408 and/or cool air aisles 406 and, thus, more computing devices 440.

At least one of the blocking walls 486 may have a size and shape corresponding to the associated outflow of exhaust air TH and/or the computing devices 440 or the device cowl 470 from which it exits to ensure a complete blocking of the associated outflow of exhaust air TH. At least one of the blocking walls 486 may have a height and/or width equal to or larger than the height and/or width of the associated outflows of exhaust air TH and/or the computing devices 440 or the device cowl 470 from which it exits. The blocking walls 486 may also be disposed a sufficient distance from each of the associated outflows of exhaust air TH to prevent one of the associated outflows of exhaust air TH from being blocked back into itself and collecting near the computing devices 440 which can lead to an overheating of the computing devices 440.

The facility 400 may also include a passive cooling mechanism 488. A passive cooling mechanism 488 is a device which cools a fluid without actively driving the fluid therethrough. Described in relation to the system, the fans of the computing devices 440 may draw air across, though, or about the passive cooling mechanism 488 thereby cooling the air, but the passive cooling mechanism 488 does not provide a meaningful flow of air, if any, into the system. As noted above, the air flow generated by the operation of the fans associated with computing devices are themselves sufficient to provide the necessary air flow even in the presence of passive cooling mechanism 488. The passive cooling mechanism 488 may be arranged to interact with the flow of cool air Tc before and/or after the cool air Tc passes through the air inlets 412. In some illustrations, the passive cooling mechanism 488 may only be operated when temperatures of the cool air Tc are determined to be too high to efficiently and/or adequately cool the computing devices 440. In some examples, the passive cooling mechanism 488 may be a misting system 490 configured to spray water in the form of mist into the cool air Tc to lower the temperature of the cool air Tc in a cost efficient and energy efficient manner, and without providing any airflow to the system.

The cool air aisle 406*a* includes a passive cooling mechanism 488 structured as a misting system 490. The misting system 490 may include a series of tubes and/or pipes which may be disposed adjacent to or coupled on the air inlets 412. When operational, the misting system 490 may spray water in the form of mist into the cool air Tc as it is drawn into the cool air aisle 406*a*. The tubes of the misting system 490 may extend up the exterior wall 402 and may be coupled to the air inlet 412 at different elevations to more evenly disperse mist into the cool air Tc. In other examples (not depicted), the passive cooling mechanism 488 and/or misting system 490 may be arranged within the facility 400 and spray mist into the cool air Tc after it has passed through the air inlets 412 and/or the filter wall 478, but prior to the cool air Tc passing through the computing devices 440.

Figure 11:
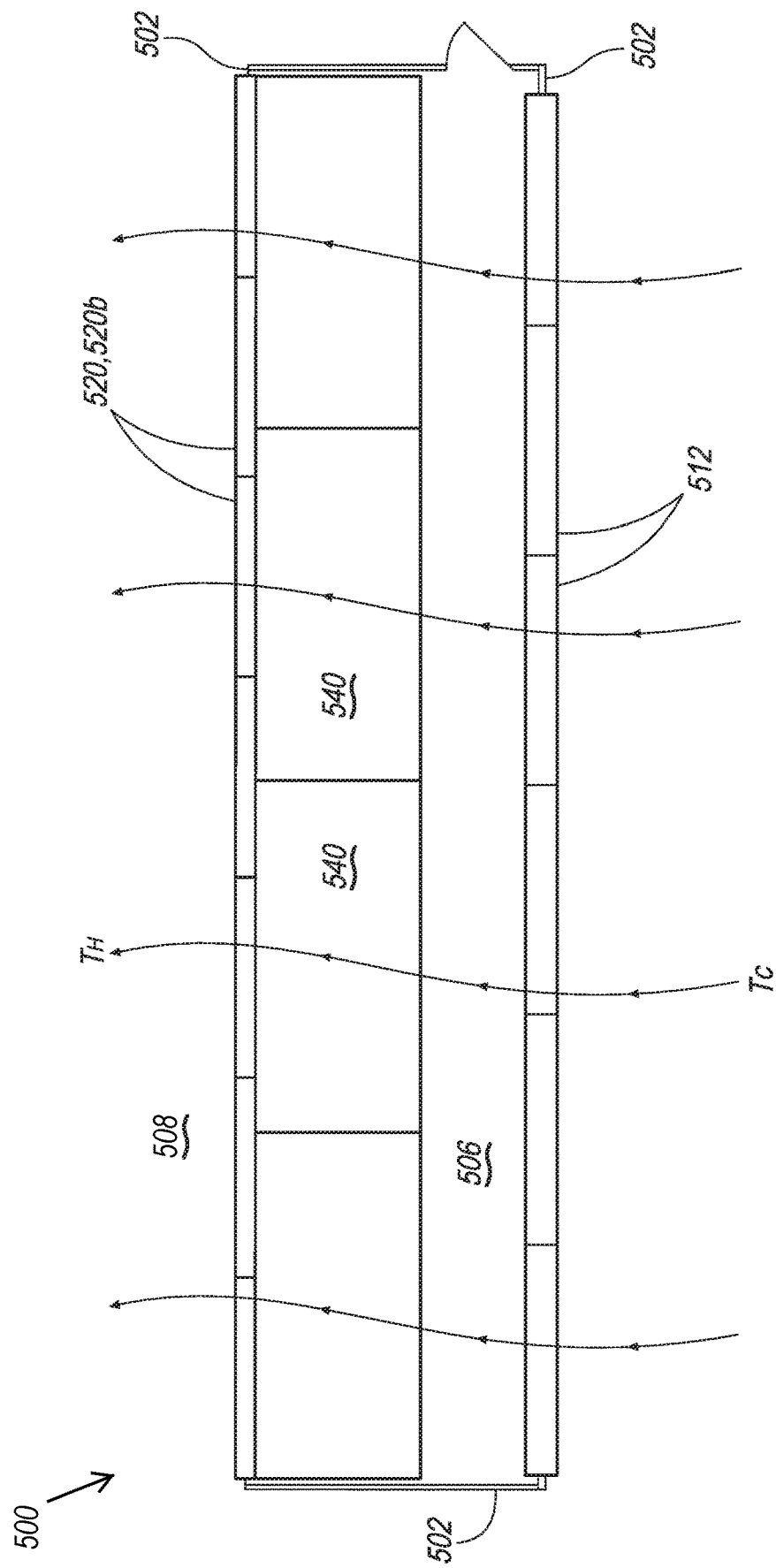
FIG. 11 illustrates another example of a system that is designed to cool computing devices within a facility including a single cool air aisle.

The exemplary facility 500 depicted in FIG. 11 is structured as a smaller unit, such as a shipping container or trailer, defined by a plurality of exterior walls 502. The facility 500, however, may also be structured similarly to facility 400. The exterior walls 502 may be thermally insulated and/or fluidically sealed similar to the walls 402. The facility 500 may include at least one cool air aisle 506, at least one hot air aisle 508, a plurality of computing devices 540, at least one air inlet 512, and at least one exhaust outlet 520. The facility 500 may be free of any other air moving device, such as a dedicated fan or blowing mechanism, and an airflow through the system and facility 500 may be driven entirely by the fans of the computing devices 540 arranged therein.

The facility 500 includes a single cool air aisle 506 defined by four external walls 502 of the facility 500. Thus, the cool air aisle 506 also serves the additional purpose of permitting access to and the servicing of the computing devices 540 in much the same way as discussed above with respect to facilities 100 and 400 while protected by facility 500 from the outside environment. The exemplary cool air aisle 506 is not partitioned or divided into a mixing chamber 216 and a computing space 256. The cool air aisle 506 is an area or space in which cool air Tc from the external environment is present. The cool air aisle 506 may be fluidically connected to at least one hot air aisle 508 and the external environment.

The facility 500 also includes a hot aisle 508 that is not partitioned or divided into a main exhaust air space 254, a recirculated hot air space 258, and a vent air space 252. The hot air aisle 408 is a space, area, and/or environment into which the exhaust air Tx is expelled after passing through, and being heated by, the computing devices 540. The exemplary hot air aisle 508 is disposed outside of the facility 500 and defined by a region of the external environment along the exterior wall 502 in which the exhaust outlets 520 are arranged.

One of the exterior walls 502 includes one or more air inlets 512 integrated therein, which fluidically connect the cool air aisle 506 with the external environment. The air inlets 512 may include a static louver, mesh screen, or other component similar to the air inlets 412. The air inlets 512 encompass a majority of the exterior wall 502 to provide a large area through which cool air Tc can flow into the cool air aisle 506. In some examples, to maximize the flow of air into the cool air aisle 506, the air inlets 512 may be structured and arranged to form an exterior wall 502 of the facility 500 thereby allowing for the flow of air through the entirety of the external wall 502.

Exhaust outlets 520 in the form of wall vents 520b are disposed in the exterior wall 502 opposite the air inlets 512. The exhaust outlets 520 may include louvers or other controls to open and/or close the exhaust outlets 520. The exhaust outlets 520 encompass a majority of the exterior wall 502 to provide a large area through which exhaust air Tx can be expelled from the facility 500. In some examples, to maximize the flow of air through the exhaust outlets 520, the exhaust outlets 520 may be structured and arranged to form an exterior wall 502 of the facility 500 thereby allowing for the flow of air through the entirety of the external wall 502.

A plurality of computing devices 540 structured similarly to computing devices 440 are disposed within the cool air aisle 506 directly adjacent to the exhaust outlets 520 and/or the exterior wall 502 in which the exhaust outlets 520 are disposed. The computing devices 540 fluidically connect the cool air aisle 506 directly to the exhaust outlets 520. In some examples, some of the computing devices 540 may be arranged such that a small gap, for example a few centimeters, is defined between the rear surface of the computing devices 540 and the exterior wall 502 in which the exhaust outlets 520 are arranged. Additionally and/or alternatively, some of the computing devices 540 may be arranged with their respective rear surface abutting one or more of the exhaust outlets 520. Conceivably, the computing devices 540 may also be arranged like the computing devices 440.

The air inlets 512 and the exhaust outlets 520 may be arranged in opposing exterior walls 502 and the computing devices 540 oriented within the facility 400 such that their respective air throughflow passage 576 essentially extends in a direction from the air inlets 512 to the air outlets 520. In such an arrangement, air flows through the facility 500 in a single direction improving the passage of cool air Tc through the computing devices 540 and the system.

Figure 12:
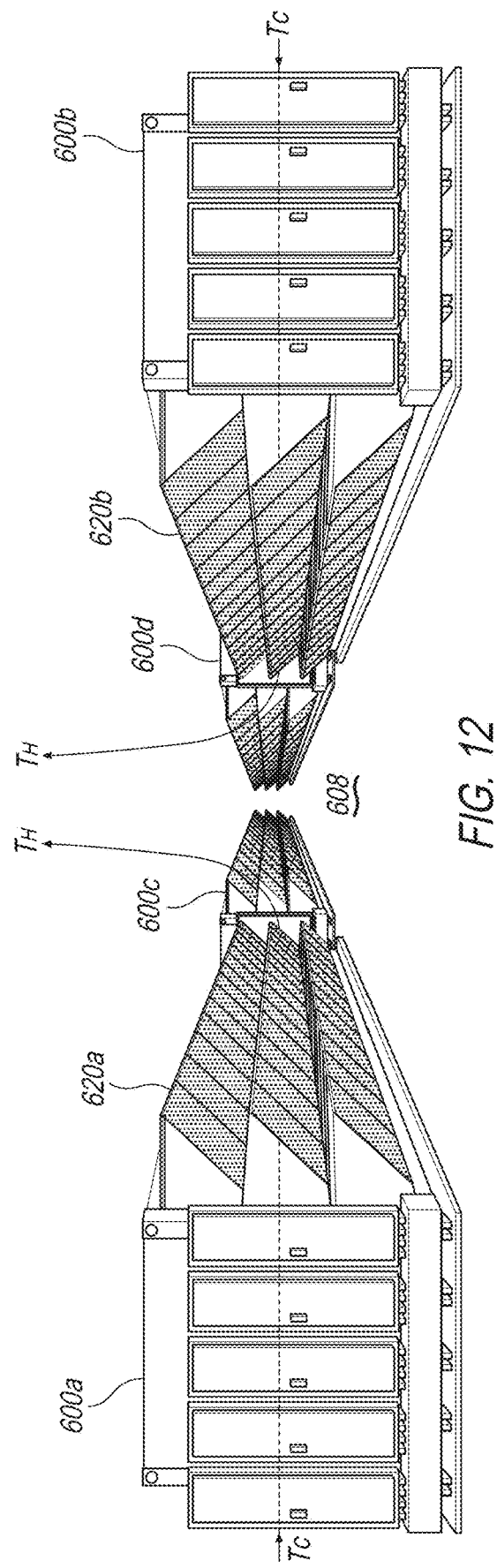
FIG. 12 illustrates an example of a system including multiple facilities.

In the example illustrated in the FIG. 12, the system may include include a plurality of facilities 600. The facilities 600 may each include a plurality of exterior walls defining a single cool air aisle, at least one air inlet, and at least one exhaust outlet configured similarly to facility 500 depicted in FIG. 11 and described above. However, it is envisioned that the system shown in FIG. 12 may also include one or more facilities 600 different from the illustrative examples herein.

The facilities 600 are arranged spaced apart from one another such that the exhaust outlets 620 of a facility 600 are spaced apart from the air inlets 612 of an adjacent facility 600 to prevent the exhaust air TH exiting one facility 600 from mixing with the ambient air being drawn into an adjacent facility 600. The facilities 600a, 600b are arranged spaced apart from one another with the exhaust outlets 620 of the facility 600a facing the exhaust outlets 620 of facility 600b. In this way, the facilities 600a, 600b share a common hot air aisle 608 which is defined as the portion of the external environment between the exhaust outlets 620a of the facility 600a and the exhaust outlets 620b of facility 600b providing a more efficient use of space and, thus, increased production for the system. The facilities 600a, 600b are also arranged spaced apart from one another a sufficient distance to prevent an outflow of exhaust air TH from the facility 600a from interfering with the opposing outflow of exhaust air TH from facility 600b, and vice versa. While not pictured, it is envisioned that one or more blocking walls 486 may be arranged between adjacent facilities 600a, 600b within the hot air aisle 608. The facilities 600c, 600d are arranged relative to one another and configured in the same manner as facilities 600a, 600b described above.

The illustrative facilities 500, 600 depicted in FIGS. 11 and 12 may conceivably include at least one filter wall, at least one distribution wall, at least one sealing mechanism, and/or at least one passive cooling mechanism as described above. In some illustrations such as shown by way of element 620b, cowls may be used, which may provide additional protection from environmental conditions. In other examples, a roof with open side walls that extends above either facility 500 and beyond the outer dimensions of the facility may also provide additional protection from environmental conditions.

During operation, the fans of the computing devices disclosed herein such as by way of devices 240 and 440 create a pressure system within the cool air aisle that is at a lower pressure than the surrounding area. As a result, the cool air Tc in the surrounding area is drawn through the air inlets and into the cool air aisles. Generally, this means that the pressure in the cool air aisle is lower than in the external environment and, thus, outside ambient air from the external environment is drawn into the cool air aisle through the air inlets. In some examples, the fans of the computing devices generate a static pressure of approximately 0.6 inAq (inches of water) (approximately 149 pascals) across the fans of the computing devices and, therefore, between the cool air aisle and the hot air aisle which they fluidically connect. As understood by a skilled artisan, "inches of water" is a non-SI unit for pressure commonly used for measurement of certain pressure differentials across a passage, duct, shaft, etc. in air under lower pressures, and defined as the pressure exerted by a column of water of 1 inch in height at defined conditions. It is also commonly referred to as inches of water gauge (iwg or in.w.g.), inches water column (inch wc), inAq, Aq, or in $H_2O$. Typically, 1 inch of water at 60° F. is equivalent to approximately 0.036 psi or 249 pascals. The fans also draw the cool air Tc disposed within the cool air aisle into and through the computing devices, across one or more heat generating components of the computing devices, and expel the now heated exhaust air Tx into a hot air aisle. In this manner, airflow through the system is substantially driven by the combined airflow of a plurality of computing device fans. Stated alternatively, the fans of the computing devices provide sufficient airflow such that supplemental mechanisms or devices are not needed to efficiently cool the computing devices. In some illustrations, the airflow is driven entirely by the fans of the computing devices such that the system is free of any other air moving device, such as a dedicated fan, supplemental flow mechanism, or blowing mechanism. Despite the heat generated by each computing device, when additively combined in a dense arrangement of computing devices as illustrated, the original or stock fans of the computing devices have been found to generate sufficient cooling airflow. The collective fans of the dense arrangement of computing devices draws additional cool air to the area of the arrangement thus producing an increase flow of the cool air Tc increasing the efficiency of the cooling and offsetting the increased amount of heat generated in the area. This allows the computing devices to generate sufficient cooling airflow through the facility and system utilizing only the original or stock fans without the additional expense of supplemental airflow mechanisms and/or cooling systems. As such, the computing devices may be densely arranged within each cool air aisle maximizing the number of computing devices within a cool air aisle and/or a facility and, thus, the production of the facility.

The combined effect of the computing device's fans may result in a considerable volume of air being moved through the system. For example, each of the computing device fans may move approximately 150 CFM of air. As such, in some examples like the one provided above where the facility and/or the individual cool air aisle includes 8,275 computing devices, the computing device fans may collectively move approximately 1,241,250 CFM of air through the system and/or the respective cool air aisle. Conceivably, the computing device fans may collectively move more than 10,000 CFM of air through the system, or between 40,000 and 60,000 CFM of air through the system like the computing devices 240 of the facility 100 described above. Similarly, the exhaust outlet(s) of a respective hot air aisle may configured such that exhaust air TH disposed within the respective hot air aisle is expelled into the external environment at a rate (e.g., in CFM) equal to or greater than exhaust air TH is discharged into the respective hot air aisle by the plurality of computing devices and/or other adjacent hot air aisles thereby preventing a buildup of exhaust air TH and air pressure therein. The air inlets, exhaust outlets, filter wall, computing devices, device cowls, and/or any other components or structures interacting with the airflow may be configured to allow airflow therethrough at an airspeed of less than or equal to 500 feet per minute. In some examples, the airflow may flow through the system and/or facility at an air speed of 300 to 500 feet per minute, or in one specific example at an air speed of approximately 421 feet per minute. An air speed of 300 to 500 feet per minute through the system provides sufficient airflow through the computing devices and system without negatively impacting the computing devices. Stated more generally, the air flow speed is at least partially influenced by the air speed threshold of the computing devices.

While the fans of each computing device are utilized to drive airflow through the system, the reality is that at any one time one or more computing devices are not operating (e.g., they break down). Sufficient redundancy is provided within the innovative system to provide sufficient air flow even if not all of the computing devices are operational at a specific time. The air pressure difference created by the fans of the computing devices is generally sufficient to prevent a backflow of exhaust air Tx into the cool air aisles, but in areas where a computing device is not operating, a localized area of backflow may be created wherein exhaust air from a hot air aisle may flow through the non-operating computing device back into the lower temperature cool air aisle in the absence of the sealing mechanisms 474.

Figure 13:
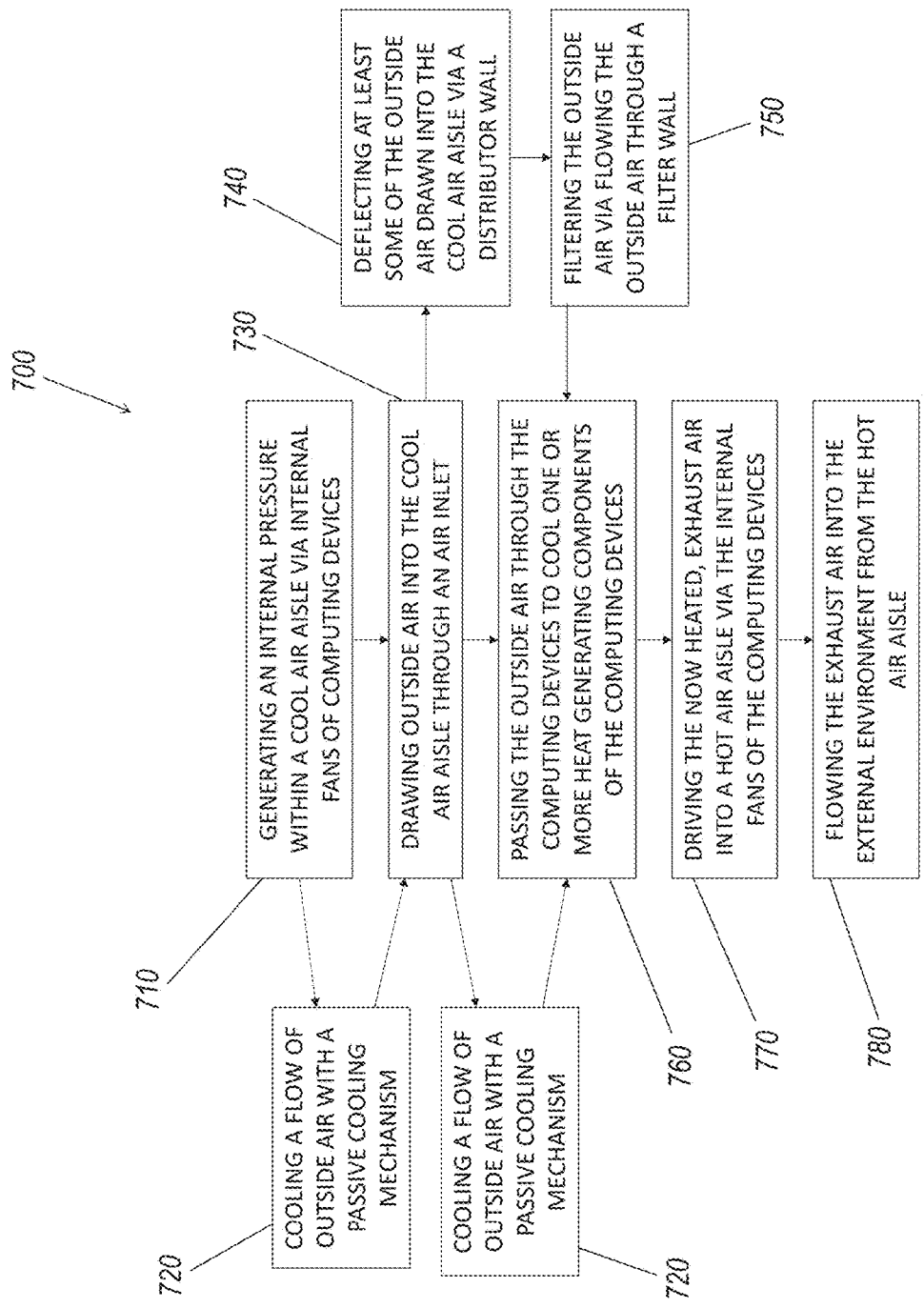
FIG. 13 illustrates a method of cooling computing devices of the system.

Referring now to FIG. 13, a method 700 of cooling computing devices of a system including at least one facility is illustrated. At block 710, the fans of computing devices arranged within a cool air aisle disposed in the facility lower the internal air pressure within the cool air aisle and/or generate a low pressure system within the cool air aisle such that the internal air pressure within the cool air aisle is lower than an air pressure in the external environment. In some examples, generating the internal air pressure within the cool air aisle may include generating a static pressure of approximately 0.6 inAq (inches of water) across the fans of the computing devices and, therefore, between the cool air aisle and a hot air aisle which the computing devices fluidically connect. Cool air within the external environment is drawn toward the air inlets, as a cool air flow, by the pressure difference created by the fans of the computing devices. At block 720, the cool air flow may be passively cooled by a passive cooling mechanism. Passively cooling the cool air flow may include spraying water in the form of mist into the cool air flow. In other examples, the cool air flow may additionally and/or alternatively be passively cooled by a passive cooling mechanism after flowing through the air inlet, but prior to flowing through the computing devices. At block 730, the cool air flow is drawn through an air inlet of the facility and into the cool air aisle due to the low pressure system generated by the fans of the computing devices. At block 740, some amount of the cool air flow may impact a distributor wall and may be redirected or deflected in an alternate direction to a desired region of the cool air aisle. At block 750, the cool air may flow through a filter wall arranged within the cool air aisle to distribute and filter the cool air thereby removing unwanted particles and debris from the outside air. At block 760, the cool air flow is drawn across and/or through the plurality of computing devices to cool one or more heat generating components of the computing devices, which in turn heats the cool air. At block 770, the hot exhaust air is driven into a hot air aisle by the fans of the computing devices. In some examples, the exhaust air may be driven into the hot air aisle through an exhaust outlet. At block 780, the exhaust air leaves the hot air aisle back and returns into the external environment. In some examples, the exhaust air may be expelled and/or dissipate from the hot air aisle into the external environment through an exhaust outlet.

Figure 8:
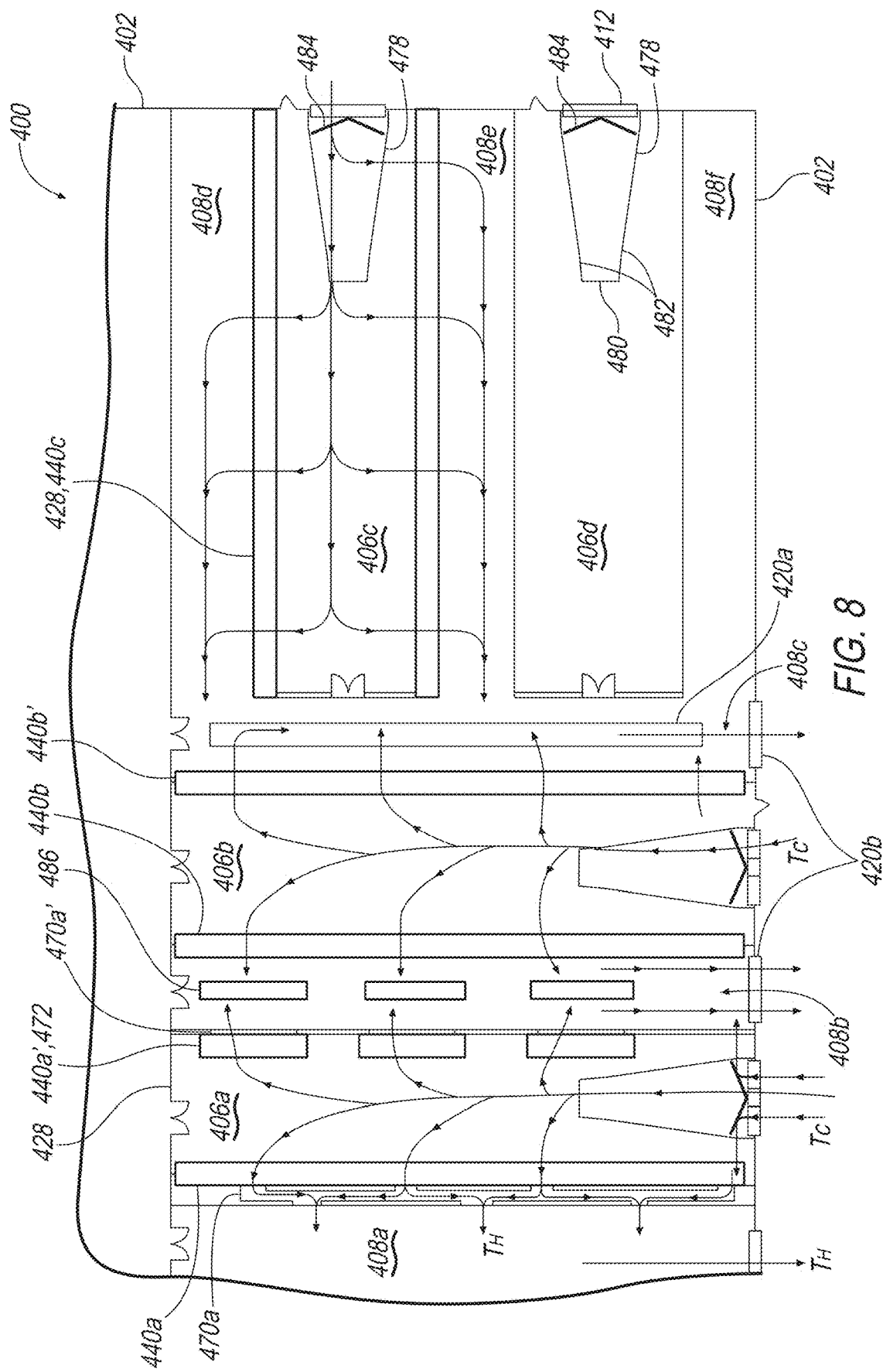
FIG. 8 illustrates another example of a system that is designed to cool computing devices within a facility.

In some examples, the system may include at least one open airflow loop where air enters and exits the system from the external environment. In open airflow loops the cool air Tc is outside ambient air which is drawn into at least one of the cool air aisles by way of exhaust fans associated with computing devices through the air inlets from the external environment and the exhaust air TH is expelled back into the external environment. Each of the cool air aisles in the illustrative facilities shown in FIGS. 8, 11, and 12 are configured as part of open airflow loops and, thus, the cool air Tc is outside ambient air drawn through the air inlets from the external environment.

Figure 14:
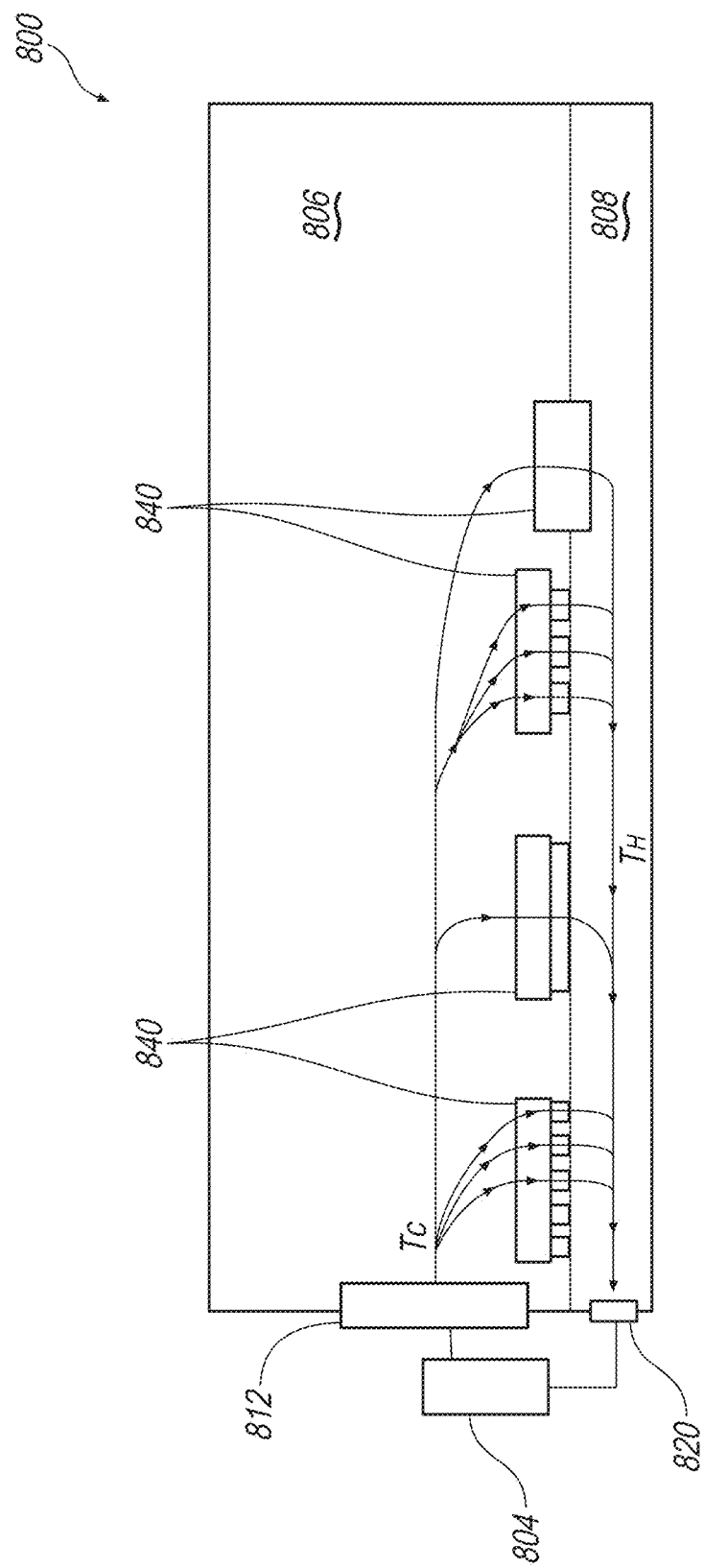
FIG. 14 illustrates an example of a closed airflow loop through a cool air aisle and a hot air aisle of a facility.

The system may also include at least one closed airflow loop. As the phrase closed airflow loop implies, the system is essentially fluidically sealed or "closed" with respect to the external environment such that air is not drawn into the system from the external environment or expelled from the system into the external environment. Closed airflow loops are commonly utilized in conjunction with cool air aisles 806 in which more heat sensitive components, machines, devices, and/or computers are operated, such as control rooms that are responsible for the overall operation of computing devices 240 located in the open airflow loop of a facility such as facilities 100 or 400 to ensure adequate cooling of these more heat sensitive components. In a closed airflow loop, an example of which is illustrated in FIG. 14, the cool air Tc may be conditioned air such as that supplied by an air conditioner 804 through the air inlets 812, and the exhaust air TH flows back into the air conditioner 804 where it is cooled and resupplied to the cool air aisle 806 as cool air Tc. In this example, the cool air Tc within the cool air aisle 806 is drawn through the computing devices 840, passes into the hot air aisle 808, flows through the exhaust outlet 820 into the air conditioner 804, and is then supplied back into the cool air aisle 806 through the air inlet 812 as cool air Tc. Passing the hot exhaust air TH from the computing devices 840 into the hot air aisle 808 in accordance with the example of FIG. 14 reduces the amount of exhaust air Tx released into the cool air aisle 806 by the computing devices 840. As such, the cool air Tc in the cool air aisle 806 is heated by the computing devices 840 at a slower rate making it is easier to maintain the cool air Tc within the cool air aisle 806 at the desired temperature. This, in turn, lowers operating costs as well as reduces strain and wear on the air conditioner 804.

While several embodiments and arrangements of various components are described herein, it should be understood that the various components and/or combination of components described in the various embodiments may be modified, rearranged, changed, adjusted, and the like. For example, the arrangement of components in any of the described embodiments may be adjusted or rearranged and/or the various described components may be employed in any of the embodiments in which they are not currently described or employed. As such, it should be realized that the various embodiments are not limited to the specific arrangement and/or component structures described herein.

In addition, it is to be understood that any workable combination of the features and elements disclosed herein is also considered to be disclosed. Additionally, any time a feature is not discussed with regard in an embodiment in this disclosure, a person of skill in the art is hereby put on notice that some embodiments of the invention may implicitly and specifically exclude such features, thereby providing support for negative claim limitations.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the device" includes reference to one or more devices and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A system for cooling computing devices, comprising:
at least one facility;
a plurality of fluidically separated cool air aisles disposed within the at least one facility, the plurality of cool air aisles each defined by a plurality of walls of the at least one facility, at least one of the plurality of walls structured as an external wall of the at least one facility;
at least one hot air aisle disposed within the at least one facility;
a plurality of air inlets connected to the at least one facility through which air is flowable, each of the plurality of cool air aisles fluidically connected to an external environment surrounding the at least one facility via a respective air inlet of the plurality of air inlets;
at least one exhaust outlet connected to the at least one facility through which air is flowable from the at least one hot air aisle to the external environment; and
a plurality of computing devices arranged within the plurality of cool air aisles, the plurality of computing devices including a plurality of heat generating components and a plurality of computing device fans configured to move air across the plurality of heat generating components, the plurality of cool air aisles and the at least one hot air aisle fluidically connected via the plurality of computing devices;
wherein an internal air pressure within the plurality of cool air aisles is lower than an external air pressure of the external environment, and the internal air pressure within the plurality of cool air aisles is provided via the plurality of computing device fans;
wherein the plurality of computing device fans are configured to provide sufficient airflow of outside air through the at least one facility to cool the plurality of computing devices; and
wherein at least one cool air aisle of the plurality of cool air aisles includes a filter wall disposed therein, the filter wall including a base section and two leg sections arranged to define a trapezoidal shape together with the respective air inlet.

2. The system according to claim 1, wherein a supplemental airflow provided via a supplemental flow mechanism is not required to provide sufficient airflow of outside air through the at least one facility to cool the plurality of computing devices.

3. The system according to claim 1, wherein the plurality of computing device fans are each configured to drive approximately 150 cubic feet of air through the at least one facility per minute.

4. The system according to claim 1, wherein the plurality of computing device fans are configured to drive the airflow through the at least one facility at an airspeed of approximately 300 to 500 feet per minute.

5. The system according to claim 1, wherein a static pressure of approximately 0.6 inAq across the plurality of computing device fans is provided via the plurality of computing device fans.

6. The system according to claim 1, wherein:
the base section is disposed spaced apart from the respective air inlet;
the two leg sections are connected to opposite ends of the base section and extend non-parallelly toward an exterior wall of the at least one facility in which the respective air inlet is disposed; and
the two leg sections are connected to the exterior wall on opposite sides of the respective air inlet such that the filter wall and the exterior wall together define the trapezoidal shape.

7. The system according to claim 1, wherein at least one cool air aisle of the plurality of cool air aisles includes at least one distributor wall disposed therein, the at least one distributor wall having at least one surface disposed at a transverse angle relative to the respective air inlet and against which at least a portion of the airflow impacts.

8. The system according to claim 1, wherein:
at least one cool air aisle of the plurality of cool air aisles includes a wedge-shaped distributor wall disposed therein; and
the wedge-shaped distributor wall is oriented such that a point of the wedge-shaped distributor wall faces the respective air inlet.

9. The system according to claim 1, further comprising a passive cooling mechanism configured to passively cool outside air drawn into at least one cool air aisle of the plurality of cool air aisles without contributing to the airflow through the at least one facility, wherein the passive cooling mechanism is structured as a misting system configured to spray mist into a flow of outside air drawn into the at least one cool air aisle.

10. The system according to claim 1, further comprising at least one blocking wall disposed within the at least one hot air aisle, wherein:
the plurality of cool air aisles includes a first cool air aisle and a second cool air aisle, the at least one hot air aisle disposed between and fluidically connected to the first cool air aisle and the second cool air aisle; and
the at least one blocking wall is arranged within the at least one hot air aisle such that an exhaust air outflow from the first cool air aisle and an exhaust air outflow from the second cool air aisle impact opposite sides of the at least one blocking wall.

11. The system according to claim 1, wherein:
at least one of the plurality of walls is an internal wall of the at least one facility;
the at least one internal wall includes at least one device cowl integrated therein; and
at least one of the plurality of computing devices is in fluid communication with the at least one hot air aisle via the at least one device cowl.

12. A method of cooling computing devices of a system including at least one facility, at least one cool air aisle disposed within the at least one facility, at least one distributor wall disposed within the at least one cool air aisle, and a plurality of computing devices disposed within the at least one cool air aisle, the method including:
generating an internal air pressure within the at least one cool air aisle via a plurality of computing device fans of the plurality of computing devices, the internal air pressure being lower than an external air pressure of an external environment surrounding the at least one facility;
drawing unconditioned outside air from the external environment into the at least one cool air aisle through at least one air inlet via the plurality of computing device fans generating the internal air pressure;
driving an overall airflow through the at least one facility at an airspeed of approximately 300 to 500 feet per minute via the plurality of computing device fans;
cooling a plurality of heat generating components of the plurality of computing devices and heating the outside air via flowing the outside air across the plurality of heat generating components;
expelling the heated outside air into a hot air aisle via the plurality of computing device fans;

wherein the plurality of computing device fans are configured to provide sufficient airflow of outside air through the at least one facility to cool the plurality of computing devices; and
wherein the at least one distributor wall has at least one surface disposed at a transverse angle relative to the at least one air inlet and against which at least a portion of the outside air impacts.

13. The method according to claim 12, further comprising deflecting a portion of the outside air drawn through the at least one air inlet to a low flow area within the at least one cool air aisle via the at least one distributor wall.

14. The method according to claim 12, further comprising distributing and filtering the outside air drawn through the at least one air inlet via a filter wall disposed within the at least one cool air aisle, the filter wall including a base section and two leg sections arranged to define a trapezoidal shape together with the at least one air inlet.

15. The method according to claim 12, further comprising spraying water in the form of mist into the outside air with a misting system prior to flowing the outside air across the plurality of heat generating components.

16. A system for cooling computing devices, comprising:
at least one facility including:
a plurality of exterior walls defining a single cool air aisle within the at least one facility;
at least one air inlet fluidically connecting the cool air aisle to an external environment surrounding the at least one facility;
at least one exhaust outlet through which air is flowable out of the at least one facility; and
a plurality of computing devices arranged within the cool air aisle along and directly adjacent to an exterior wall of the plurality of exterior walls in which the at least one exhaust outlet is disposed;
a hot air aisle disposed directly adjacent to the at least one exhaust outlet;
wherein the plurality of computing devices include a plurality of heat generating components and a plurality of computing device fans configured to move air across the plurality of heat generating components, the cool air aisle and the hot air aisle fluidically connected via the plurality of computing devices;
wherein a static pressure across the plurality of computing device fans is provided between the cool air aisle and the hot air aisle such that outside air within the external environment is drawn into the cool air aisle, the static pressure provided via the plurality of computing device fans;
wherein the plurality of computing device fans are configured to provide sufficient airflow of outside air through the at least one facility to cool the plurality of computing devices;
wherein the at least one air inlet and the at least one exhaust outlet are respectively disposed in opposing exterior walls of the plurality of exterior walls such that the airflow through the at least one facility follows a flow path that substantially extends in a single direction from the at least one air inlet to the at least one exhaust outlet;
wherein the at least one facility includes a first facility and a second facility;
wherein the at least one exhaust outlet of the first facility is disposed in an exterior wall of the first facility facing the second facility, and the at least one exhaust outlet of the second facility is disposed in an exterior wall of the second facility facing the first facility; and wherein the first facility and the second facility are arranged spaced apart from one another and a portion of the external environment disposed therebetween defines the hot air aisle.

17. The system according to claim 16, wherein, within at least one of the first facility and the second facility, the plurality of computing devices are arranged as an array including a series of columns and rows extending along the exterior wall, the array of computing devices covering an entirety of the at least one exhaust outlet.

18. The system according to claim 16, wherein the hot air aisle is disposed outside of the first facility and the second facility, and wherein the portion of the external environment defining the hot air aisle is disposed directly adjacent to the at least one exhaust outlet of the first facility and the at least one exhaust outlet of the second facility.

19. The system according to claim 16, wherein the flow path is a substantially linear flow path extending through the respective facility.

20. The system according to claim 16, further comprising at least one blocking wall disposed within the hot air aisle, wherein the at least one blocking wall is arranged within the hot air aisle such that an exhaust air outflow from the first facility and an exhaust air outflow from the second facility impact opposite sides of the at least one blocking wall.

* * * * *